US011604290B2

(12) United States Patent
Yadegari et al.

(10) Patent No.: US 11,604,290 B2
(45) Date of Patent: Mar. 14, 2023

(54) LOW POWER DUAL-SENSITIVITY FG-MOSFET SENSOR FOR A WIRELESS RADIATION DOSIMETER

(71) Applicant: BEST MEDICAL CANADA LTD., Ottawa (CA)

(72) Inventors: Behzad Yadegari, Ottawa (CA); Steven McGarry, Ottawa (CA); Langis Roy, Whitby (CA)

(73) Assignee: Best Theratronics, Ltd.

( * ) Notice: Subject to any disclaimer, the term of this patent is extended or adjusted under 35 U.S.C. 154(b) by 239 days.

(21) Appl. No.: 17/008,143

(22) Filed: Aug. 31, 2020

(65) Prior Publication Data

US 2021/0096268 A1    Apr. 1, 2021

Related U.S. Application Data

(60) Provisional application No. 62/906,526, filed on Sep. 26, 2019.

(51) Int. Cl.
*G01T 1/02* (2006.01)
*H01L 27/146* (2006.01)
(Continued)

(52) U.S. Cl.
CPC ........ *G01T 1/026* (2013.01); *H01L 27/14659* (2013.01); *H01L 29/42324* (2013.01); *H01L 29/788* (2013.01); *H01L 31/119* (2013.01)

(58) Field of Classification Search
CPC ............... G01T 1/026; H01L 27/14659; H01L 29/42324; H01L 29/788; H01L 31/119; H01L 27/1443
See application file for complete search history.

(56) References Cited

U.S. PATENT DOCUMENTS 6,204,764 B1   3/2001 Maloney
6,228,715 B1 *  5/2001 Shimoji ............ H01L 27/11521
                                                      438/279
(Continued)

FOREIGN PATENT DOCUMENTS

CA         2215369         3/1999
CA         3065746         2/2019
(Continued)

OTHER PUBLICATIONS

Toth, Stephen, "An Efficient RF Rectifier for Energy Harvesting Systems with Applications to Wireless Dosimetry," Carleton University, MSc Thesis 2014, 203 pages.
(Continued)

*Primary Examiner* — Kiho Kim

(57) ABSTRACT

Low-power, dual sensitivity thin oxide FG-MOSFET sensors in RF-CMOS technology for a wireless X-ray dosimeter chip, methods for radiation measurement and for charging and discharging the sensors are described. The FG-MOSFET sensor from a 0.13 μm (RF-CMOS process, includes a thin oxide layer having a device region, a source and a drain associated with the device well region, separated by a channel region, a floating gate extending over the channel region, and a floating gate extension extending over the thin oxide layer adjacent to the device well region. In a matched sensor pair for dual sensitivity radiation measurement, the floating gate and the floating gate extension of a FG-MOSFET higher sensitivity sensor are without a salicide layer or a silicide layer formed thereon and the floating gate and the floating gate extension of a FG-MOSFET lower sensitivity sensor have a salicide layer or a silicide layer formed thereon.

16 Claims, 20 Drawing Sheets

(51) Int. Cl.
*H01L 29/788* (2006.01)
*H01L 29/423* (2006.01)
*H01L 31/119* (2006.01)

(56) References Cited

U.S. PATENT DOCUMENTS

| | | |
|---|---|---|
| 7,420,524 B2 | 9/2008 | Werner et al. |
| 7,652,268 B2 | 1/2010 | Patel |
| 7,831,016 B2 | 11/2010 | Saoudi et al. |
| 10,152,667 B2 | 12/2018 | Gabriel et al. |
| 11,043,729 B2 | 6/2021 | Roy et al. |
| 2001/0033233 A1 | 10/2001 | Jentsch et al. |
| 2003/0231142 A1 | 12/2003 | McKinzie, III et al. |
| 2004/0233043 A1 | 11/2004 | Yazawa et al. |
| 2010/0096556 A1 | 4/2010 | Arsalan et al. |
| 2010/0188306 A1 | 7/2010 | Kitayoshi et al. |
| 2011/0006878 A1 | 1/2011 | Nyffeler et al. |
| 2011/0168920 A1 | 7/2011 | Yoder |
| 2012/0001235 A1* | 1/2012 | Fife ............... H01L 29/6659 257/253 |
| 2013/0033700 A1 | 2/2013 | Hallil |
| 2013/0292763 A1* | 11/2013 | Chang ............ H01L 29/7816 257/335 |
| 2015/0116093 A1 | 4/2015 | Swager et al. |
| 2015/0192475 A1 | 7/2015 | Eisenstadt et al. |
| 2017/0098894 A1 | 4/2017 | Kawata |
| 2019/0036206 A1 | 1/2019 | de Rochemont |
| 2020/0251806 A1 | 8/2020 | Roy et al. |

FOREIGN PATENT DOCUMENTS

| | | |
|---|---|---|
| CN | 201654818 | 11/2010 |
| FR | 2945128 A | 11/2010 |

OTHER PUBLICATIONS

Hickman Susan, "NSERC grant boosts research on tiny sensor with great potential in biomedicine", Available at Carleton Now—http://carletonnow.carleton.ca, Dec. 11, 2013, 1 page.
P. Padilla De La Torre et al., "Characterization of artificial magnetic conductor strips for parallel plate planar antennas", vol. 50, Issue 2, Microwave and Optical Technology Letters, Dec. 2007, 7 pages.
Yadegari, Behzad, "Low Power Gamma-Ray FG-MOSFET Dosimeter in 0.13 um CMOS Technology", Carleton University, MSc Thesis, 2012, 143 pages.
CMC Microsystems, "University expertise develops X-ray sensor for Canadian Biomedical company", Success Stories, Annual Report, 2013/2014, 3 pages.
Yadegari, Behzad et al., "An Efficient and Compact Wireless Solution for Blood Sterilization Apparatus", ANTEM, Jul. 2018, 3 pages.
CMC Microsystems, "University expertise develops X-ray sensor for Canadian Biomedical company", Impact, Feb. 2014, 1 pages.
PCT International Search Report, PCT/CA2020/051242, dated Nov. 25, 2020, 6 pages.
PCT Written Opinion of the International Searching Authority, PCT/CA2020/051242, dated Nov. 25, 2020, 5 pages.
Yadegari, Behzad, "Low Power Wireless CMOS System-on-Chip X-Ray Dosimeter", Carleton University, Doctor of Philosophy Thesis, 2019, 183 pages.
Pejovic et al., "Application of pMOS Dosimeters in Radiotherapy", Chapter 12, Radiotherapy, 2017, 21 pages.
C. Zhang and S. M. R. Hasan, "A New Floating-gate Radiation Sensor and Readout Circuit in Standard Single-Poly 130-nm CMOS Technology," IEEE Transactions on Nuclear Science, vol. 66, No. 7, pp. 1906-1915, Jul. 2019.
U.S. Appl. No. 17/308,668, filed May 5, 2021, Langis Roy et al.
U.S. Appl. No. 17/010,713, filed Sep. 2, 2020, Behzad Yadegari et al.

* cited by examiner

LOW POWER DUAL-SENSITIVITY FG-MOSFET SENSOR FOR A WIRELESS RADIATION DOSIMETER

CROSS-REFERENCE TO RELATED APPLICATION

This application claims priority under 35 U.S.C. § 119 to U.S. Provisional Patent Application No. 62/906,526, filed on Sep. 26, 2019, all of which is hereby incorporated herein by reference in their entirety.

1. FIELD OF THE INVENTION

The present invention relates generally to medical sensors, and more particularly, to a low power floating gate metal-oxide semiconductor field-effect transistor (FG-MOSFET) for use in a wireless dosimeter tag for biomedical applications, such as for determination of a radiation dosage.

2. DESCRIPTION OF RELATED ART

The global market for medical sensors has experienced significant growth in recent years and is expected to continue growing at an accelerated rate. In fact, the global market demand for medical sensors is expected to increase more than 50% by the year 2016 compared to 2006. This trend can be attributed to both constant innovation in sensor system design and the proliferation of novel applications for sensors, including X-ray imaging and radiation dosimetry. The latter category refers to sensors which measure X-ray and gamma radiation, also known as ionizing radiation. These sensors are used in a variety of critical procedures, including radiotherapy for cancer treatment and blood irradiation for sterilization. In an effort to minimize costs, the medical industry has expressed growing interest over the use of inexpensive, silicon-based, multi-sensitivity radiation dosimeters, thus defining a new pathway for research in this area to meet the set forth requirements.

Recent research initiatives for biomedical applications have addressed the design of flexible and wearable medical devices for early disease detection and prevention health monitoring and reduction of invasive medical procedures. This has created an increasing demand for flexible, conformal, compact, low-power wireless power transfer (WPT) modules that are easy to fabricate, low-cost and maintain efficient performance on diverse host structures. A number of sensors having a variety of functionalities for the targeted application have been reported in the prior art. These include passive and active circuit designs.

For example, US Patent Application, US2010/0096556A1 to Langis Roy et al., incorporated herein by reference it its entirety, discloses a miniaturized floating gate metal-oxide semiconductor field-effect transistor (FG-MOSFET) radiation sensor. The sensor preferably comprises a matched pair of sensor and reference FG-MOSFETs wherein the sensor FG-MOSFET has a larger area floating gate with an extension over a field oxide layer, for accumulation of charge and increased sensitivity.

Several patents have been issued on color changing indicators, monitors, detectors, and dosimeters for monitoring a variety of biomedical processes. For example, US patent application, US 2011/0168920 A1 to Yoder et al. discloses a device comprising a dosimeter for measuring one or more doses of radiation; and an RFID tag comprising an antenna for communicating with an RFID tag reader and non-volatile memory for storing data therein. This disclosure utilizes an optically stimulated luminescence (OSL) sensor that includes a reference filter material and is used to adjust the dose determined by the reference sensor at very low energies of x-rays or gamma rays.

For example, U.S. Pat. No. 7,652,268 to Patel et al. discloses a general purpose dosimeter reader for determination of a radiation dosage, based on comparison of an image of a treated dosimeter with a series of images of a pre-treated dosimeter. The dosimeter undergoes a color change proportional to the dosage. The sensor may have more than one indicator of the same or different classes. The color change may be a gradual color development or intensification; a gradual color fading: a gradual color change or an abrupt color change.

For example, U.S. Patent Application US2015/0116093A1 to Swager discloses a method of detecting a stimulus that can include detecting an output from a radio frequency identification tag including a sensor. The sensor portion is configured to change resistivity when the stimulus contacts or interacts with the radio frequency identification tag, whereby the resistivity change alters the output of the radio frequency identification tag, wherein the radio frequency identification tag includes a carbon nanotube or multiple carbon nanotubes.

For example, the French Patent Application, FR2945128A1 discloses a dosimeter for use during a radiotherapy treatment session, which has a printed circuit board wrapped in an envelope forming material, and a metal-oxide semiconductor field-effect transistor (MOSFET) placed on a printed circuit board. A RFID (radiofrequency identification device) to identify the dosimeter using an electronic device such as a memory chip containing data and capable of using an antenna to transmit information to a reader is also disclosed. The RFID device may be integrated to the printed circuit board or retrofitted thereon.

One area where such low-power wireless power transfer (WPT) modules may be beneficial is the preparation of blood products for medical applications, such as to prevent the transfusion-associated graft versus host disease (TA-GvHD), where it is imperative that the blood products are irradiated using X-ray or gamma ray sources. The current radiation measurement technology for each blood bag typically relies on radiation sensitive paper tags affixed to each bag that change color when exposed to radiation. The color intensity of the tag indicator corresponds with the radiation duration of which an allowed radiation dose or deposit is typically up to 50 Gray (Gy) of radiation in each blood bag. Using the visual observation of the shade of the color of the tag to deduce the cumulative radiation dose delivered to a blood bag can lead to an erroneous or inaccurate reading or result in that it is typically prone to human judgment. Therefore, a blood bag that has received, based on such visual observation of the paper tag, above the allowed dose, such as 50 Gy, must be discarded, even though in actuality it may have actually received a radiation dose of 50 Gy or less, resulting in a serious wastage of blood products.

Presently, blood products are irradiated in chambers using X-ray or gamma-ray sources to prevent transfusion associated graft versus host disease (TA-GvHD). Typically, blood product irradiation is identified using radiation-sensitive color indicators known as RadTags. Once applied to the blood bags, these labels give positive, visual verification of irradiation provided when a minimum of 25 gray (Gy) has been received. For example, after irradiation, a human operator visually checks the color on each tag to verify that the blood is sufficiently irradiated. However, this non-quantitative approach makes it difficult for a human operator to ascertain whether or not the blood in the blood bag under irradiation has received over 50 Gy, a maximum recommended dosage, thereby resulting in operational and cost inefficiencies. Currently available dosimeters cannot easily be integrated onto integrated circuits (ICs) for automatic readout; therefore, where many blood bags are being irradiated, it takes time to process all the bags and precision is lost as the operator gets tired. Moreover, RadTags are not reusable, hence increasing the cost of blood sterilization when large quantities are involved.

Generally in FG-MOSFET devices ionizing radiation sensing by floating gate MOS involves pre-charging and sensing of a floating gate MOS sensor. Initially the floating gate is pre-charged with excess charge using a series of negative pulses from an external source. Ionizing irradiation creates electron-hole pairs inside the thick oxide layer formed under the floating gate extension. The generated electrons and holes are separated from each other due to the electric field that exists within the deep oxide formation. The electrons from the floating gate recombine with the generated holes that are attracted to them or in another mechanism the excess electrons on the floating gate receive enough energy from the incident X-ray photons so that they could escape the floating gate. Moreover, the dielectric layer on top of and around the floating gate extension contributes holes generated by ionizing radiation, which in turn recombine with the excess electrons. These mechanisms cause a reduction of charge inside the floating gate which is reflected in the output current. By sensing this change in the current value, the cumulative incident radiation on the device can be determined.

However, previous dosimeter designs have been implemented in an older (thick oxide) CMOS process which is ideal for dosimeter sensitivity, but generally not typically-suited to any form of RF wireless readout, although the thicker oxide can facilitate prevention of charge leakage out of the floating gate. Moreover, on the other hand, as the gate-oxide thickness reduces, the MOSFET typically becomes less sensitive to radiation. Also challenges are present in the use of a FG-MOSFET as a radiation sensor in relation to physical parameters that can significantly alter the FG-MOSFET's performance, particularly its sensitivity.

Also, as to other concerns, as holes pile up in oxide traps during irradiation, the space charge alters the oxide electric field which can typically decrease the yield (increasing the recombination of generated charge), leading to a sub-linear (less sensitive) response. Further, as more space charge accumulates in the oxide with increased dosage, the low-field area in oxide starts to expand towards the silicon and the trapped-hole distribution becomes more restricted to the area near the silicon/silicon dioxide ($Si/SiO_2$) interface, typically resulting in sensitivity being lost beyond this point. Moreover, a further concern is that MOS characteristics are typically not stable with time, commonly referred to as fading, as can be undesirable if the irradiation result measured is to be accessed over a relatively long period of time. Finally, previous dosimeter designs have typically exhibited only a single, fixed value of sensitivity, which is generally tailored to a single, specific application.

It is evident from the current state of art that while a FG-MOSFET radiation sensor can be used to measure irradiation, such FG-MOSFET sensors typically have the aforementioned drawbacks and limitations that are not particularly suitable for a wireless dosimeter and wireless dosimeter radiation measurements that may require variable sensitivity.

Also, it would be desirable to replace the conventional radiation tags with their limitations, as discussed, by providing a FG-MOSFET radiation sensor that can accurately measure the cumulative dose of radiation a substance or object received, such as received by blood bags, and provide methods for realizing such FG-MOSFET radiation sensor for use as dosimeters.

What is needed is a FG-MOSFET sensor for use in a wireless radiation dosimeter formed of a thin-oxide that can be integrally formed on an integrated circuit chip, such as for measuring X-rays or other radiation that can accurately quantify the measured radiation, such as the irradiation level of blood.

Further, what is needed is a wireless radiation dosimeter that can be fabricated as a low cost semiconductor device, using a commercially available low cost semiconductor process, and that addresses limitations in the currently used technology for radiation measurement, such as wastage of blood, handling errors, and uncertainties of the exact radiation dose received, such as an X-ray dose received.

Also, what is also needed is a FG-MOSFET radiation sensor for use in conjunction with a wireless dosimeter formed on an integrated circuit chip that facilitates providing sensitivity to radiation energies, accuracy in radiation measurements, and reduced fading in relation to MOS characteristics to be able to maintain the charge pre-irradiation and post-irradiation, such as for measuring the irradiation of blood products.

In this regard, what is needed is a FG-MOSFET radiation sensor in RF-CMOS technology for use in a monolithically integrated radiation dosimeter, such as for measuring X-Ray radiation, with wireless readout capability and that can be manufactured using commercially available, low-cost radio-frequency complementary metal-oxide semi-conductor (RF-CMOS) processes, such as a 0.13 μm RF-CMOS process, desirably with a thin oxide structure for a monolithically integrated radiation sensor for use in wireless dosimetry.

Therefore, in view of the foregoing, it would be desirable to have a FG-MOSFET radiation sensor suitable for a wireless dosimeter formed in a monolithic integrated circuit in a 0.13 μm RF-CMOS process in conjunction with a wireless dosimeter that addresses the aforementioned and other drawbacks, needs and limitations.

SUMMARY OF INVENTION

Embodiments of a low-power FG-MOSFET sensor in RF-CMOS technology for a wireless radiation dosimeter, such as for a wireless X-Ray dosimeter or dosimeter tag for detecting radiation dose are described.

Also, embodiments of a low-power FG-MOSFET sensor and a low-power FG-MOSFET sensor pair in RF-CMOS technology are described for wireless dosimeter radiation tags that facilitate enabling measuring a relatively exact cumulative dose of radiation received by blood bags and provide the methods for realizing such low-power FG-MOSFET sensors.

Further, embodiments of a low-power FG-MOSFET sensor and a low-power FG-MOSFET sensor pair in RF-CMOS technology are described for wireless dosimeter radiation tags that enable the use of RF-CMOS technology enabling a low-power FG-MOSFET sensor and a low-power FG-MOSFET sensor pair to have relatively extremely thin gate oxide layers for efficient RF operation in conjunction with their incorporation into an integrated circuit chip structure for a wireless dosimeter.

Although, various components are integral to an embodiment of the dosimeter tag, embodiments of the invention particularly relate to the structure, design, fabrication and properties of a FG-MOSFET sensor for use as a radiation dosimeter in a wireless dosimeter tag.

Embodiments of a low-power FG-MOSFET sensor in RF-CMOS technology for a wireless radiation dosimeter, such as an X-ray dosimeter, are described. Embodiments of a low power floating gate metal-oxide semiconductor field-effect transistor (FG-MOSFET) sensor from a 0.13 μm radio frequency complementary metal-oxide semiconductor (RF-CMOS) process, include a thin oxide layer from the 0.13 μm RF-CMOS process including a device well region, a source and a drain associated with the device well region, separated by a channel region, a floating gate extending over the channel region, and a floating gate extension communicating with the floating gate and extending over the thin oxide layer from the 0.13 μm RF-CMOS process adjacent to the device well region, wherein the floating gate and the floating gate extension are each without a salicide layer or a silicide layer formed thereon.

Also, in radiation measurements, embodiments of a low-power FG-MOSFET sensor matched pair for a dual sensitivity wireless radiation dosimeter, such as an X-ray dosimeter, are described. Embodiments of the matched sensor pair of low power floating gate metal-oxide semiconductor field-effect transistor (FG-MOSFET) sensors from a 0.13 μm radio frequency complementary metal-oxide semiconductor (RF-CMOS) process, include a FG-MOSFET higher sensitivity sensor and a FG-MOSFET lower sensitivity sensor, the MOSFET higher sensitivity sensor having a higher sensitivity $S_1$, such as measured in Amperes/centiGray (A/cGy), than a sensitivity $S_2$ (A/cGy) of the FG-MOSFET lower sensitivity sensor, from the 0.13 μm RF-CMOS process on a common substrate. The FG-MOSFET higher sensitivity sensor and the FG-MOSFET lower sensitivity sensor each including a thin oxide layer from the 0.13 μm RF-CMOS process and including a device well region, a source and a drain associated with the device well region, separated by a channel region, a floating gate extending over the channel region, and a floating gate extension communicating with the floating gate and extending over a shallow trench isolation (STI) from the 0.13 μm RF-CMOS process adjacent to the device well region, wherein the floating gate and the floating gate extension of the FG-MOSFET higher sensitivity sensor are each without a salicide layer or a silicide layer formed thereon, and the floating gate and the floating gate extension of the FG-MOSFET lower sensitivity sensor each have a salicide layer or a silicide layer formed thereon.

Further, embodiments of methods for measuring a radiation dose using embodiments of the matched sensor pair of low power FG-MOSFET sensors from a 0.13 μm RF-CMOS process, include the steps of pre-charging the floating gates of each of the FG-MOSFET higher sensitivity sensor and the FG-MOSFET lower sensitivity sensor to a predetermined voltage value, exposing the FG-MOSFET higher sensitivity sensor and the FG-MOSFET lower sensitivity sensor to radiation from a radiation source, measuring a drain source channel current $I_{DS}$ for each of the FG-MOSFET higher sensitivity sensor and the FG-MOSFET lower sensitivity sensor exposed to the radiation from the radiation source for a given radiation duration time T, determining a first sensitivity $S_1$ corresponding to the measured drain source channel current $I_{DS}$ at the given radiation duration time T for the FG-MOSFET higher sensitivity sensor, determining a second sensitivity $S_2$ corresponding to the measured drain source channel current $I_{DS}$ at the given radiation duration time T for the FG-MOSFET lower sensitivity sensor.

Also, embodiments of methods for pre-charging a low power FG-MOSFET sensor from a 0.13 μm RF-CMOS process for radiation dose measurements and for discharging the low power FG-MOSFET sensor from a 0.13 μm RF-CMOS process to enable another radiation dose measurement to be made by the low power FG-MOSFET sensor are described. Desirably, for pre-charging a floating gate of the FG-MOSFET sensor negative voltage pulses of −7.0 volts (V) having a pulse width of 0.5 microseconds (μs) are applied to the floating gate of the FG-MOSFET sensor. Also, desirably, for discharging the floating gate of the FG-MOSFET sensor, positive voltage pulses of 7.0 volts (V) having a pulse width of 0.5 microseconds (μs) are applied to the floating gate of the FG-MOSFET sensor.

These, and other features of the invention, will become more apparent from the following specification and drawings, in which reference is made to the appended drawings, illustrating embodiments of the invention, by way of example only.

DESCRIPTION OF THE DRAWINGS

Unless otherwise indicated, similar reference characters denote corresponding features consistently throughout the attached drawings.

DETAILED DESCRIPTION

Figure 1:
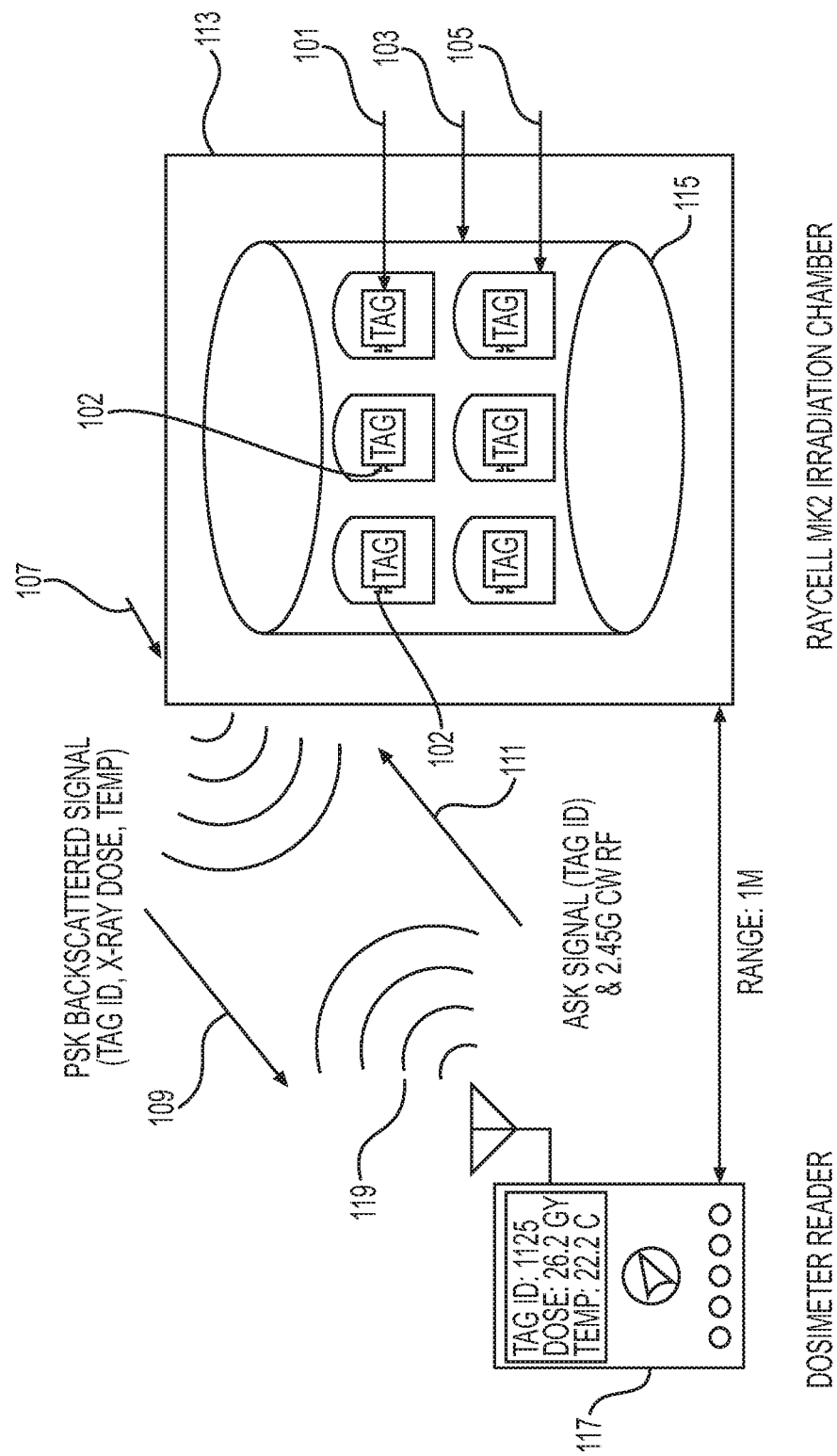
FIG. 1 is a system-level diagram illustrating embodiments of a system and a method for determining an amount of delivered radiation dose to blood bags each associated with a wireless X-ray dosimeter chip-enabled tag having the predetermined ID, according to the present invention.

Embodiments of the disclosure relate to designs of a low-power FG-MOSFET sensor in RF-CMOS technology for use with a radio-frequency identification (RFID) wireless dosimeter chip-enabled tag, such as can be applied to blood bags, that are to be irradiated by a radiation source, such as an X-ray source, and to methods for measuring the radiation dose delivered using embodiments of a low-power FG-MOSFET sensor in RF-CMOS technology.

The term "irradiation", as is used herein, can include, but is not limited to the conventional meaning of the term "irradiation", i.e., exposure to high energy charge particles, e.g., electrons, protons, alpha particles, etc., or electromagnetic radiation of wave-lengths shorter than those of visible light, e.g., gamma rays, X-rays, UltraViolet, etc.

Further, as used herein, for example, the term "dosimeter" refers to a device used to measure an absorbed dose of ionizing radiation.

Also, as used herein, the term "ionizing radiation" refers to any of various particulate radiation or electromagnetic radiation that is capable of dissociating atoms into a positively and negatively charged ion pair.

In an embodiment, a low-power FG-MOSFET sensor in RF-CMOS technology for use with a RFID wireless dosimeter chip includes an FG-MOSFET device in RF-CMOS technology compatible with commercially available, low-cost RF-CMOS processes, such as a 0.13 μm RF-CMOS process, for its use in a monolithically integrated X-ray radiation dosimeter with wireless readout capability.

In another embodiment, a low-power FG-MOSFET sensor in RF-CMOS technology for use with a RFID wireless dosimeter chip includes an FG-MOSFET device in RF-CMOS technology that includes a low-power FG-MOSFET sensor formed without a passivation layer to maintain the sensitivity of the sensor, the presence of a passivation layer reducing the sensitivity of the low-power FG-MOSFET sensor.

In another embodiment, a low-power FG-MOSFET sensor in RF-CMOS technology for use with a RFID wireless dosimeter chip includes a metal protection layer on the surface of the low-power FG-MOSFET sensor to reduce and facilitate isolation of the low-power FG-MOSFET sensor from external RF interferences.

In an exemplary embodiment, a low-power FG-MOSFET sensor in RF-CMOS technology for use with a RFID wireless dosimeter chip has at least one gate finger and desirably a plurality of gate fingers, that communicate with a floating gate extension that receives the radiation, the plurality of gate fingers providing enhanced efficiency and flexibility and freedom to satisfy optimum device layout requirements for the low-power FG-MOSFET sensor structure.

In various exemplary embodiments, the low-power FG-MOSFET sensor in RF-CMOS technology devices, given its thin-film oxide structure, is desirably charged or discharged using patterns of square pulses. In embodiments of the low-power FG-MOSFET sensor in RF-CMOS technology, in order to pre-charge the gate (tunnel electrons onto the FG) negative pulses of 0.5 microseconds (μs) with a pulse height of −7.0 Volts (V) are applied, and similar pulse height and width but in opposite polarity (+7.0 V) are applied to discharge the gate of the low-power FG-MOSFET sensor. Thus, these charging and discharging pulses can be applied to the low-power FG-MOSFET sensor when the low-power FG-MOSFET sensor is to be charged or discharged depending upon the use or application.

The following examples are provided by way of illustration to further illustrate the exemplary embodiments of a low-power FG-MOSFET sensor for use with an X-ray wireless dosimeter chip-enabled tag for blood bags and a method of detecting radiation by the low-power FG-MOSFET sensor. However, the embodiments of a low-power FG-MOSFET sensor and associated wireless dosimeter chip-enabled tags can have other uses or applications, and therefore such examples are not intended to limit its scope or application.

FIG. 1 is a system-level diagram illustrating embodiments of a system and a method for determining an amount of delivered radiation dose to blood bags each associated with a wireless X-ray dosimeter chip-enabled tag having the predetermined ID, the wireless X-ray dosimeter chip-enabled tag including embodiments of low-power FG-MOSFET sensor in RF-CMOS technology. In an exemplary embodiment of FIG. 1, there is shown a system-level diagram for determining an amount of a delivered radiation dose to blood in blood bags including a wireless dosimeter chip-enabled tag 101, such as for measuring a radiation dose from X-rays, in communication with a specific blood bag 105, a plurality of blood bags 105 and associated wireless dosimeter chip-enabled tags 101 being illustrated in FIG. 1, housed inside an irradiation apparatus 113, such as a Raycell MK2 Blood Irradiator.

The RFID wireless dosimeter chip-enabled tags 101 are applied to corresponding specific blood bags 105 and the blood bags 105 associated with the RFID wireless dosimeter chip-enabled tags 101 are then placed in an irradiation canister 115 of the irradiation apparatus 113. Each wireless dosimeter chip-enabled tag 101 has an identification (ID) value corresponding to a specific blood bag 105. The irradiation apparatus 113 includes an inner canister 103 that houses the blood bags 105 including the blood to be irradiated. The irradiation canister 115 and the irradiation apparatus 113 can also include an RF opening or portal 107 through which the RFID wireless dosimeter chip-enabled tags 101 through an associated antenna 102 can communicate with a dosimeter reader 117. An amplitude-shift keying (ASK) signal (Tag ID 2.45 GHz RF signal) 111 is transmitted from the dosimeter reader 117 though an antenna 119. The signal transmitted from the dosimeter reader 117, such as a modulated radio frequency signal, contains the predetermined ID value corresponding to the wireless dosimeter chip-enabled tag 101 associated with the predetermined ID value. After receipt of the signal 111 from the dosimeter reader 117 received by the corresponding antenna 102, a back scattered signal 109 from the corresponding wireless dosimeter chip-enabled tag 101 associated with the predetermined ID value containing the information from the respective wireless dosimeter chip-enabled tag 101 is transmitted by the respective antenna 102 and received by the antenna 119 of the dosimeter reader 117. The received back scattered signal 109 containing the information or data corresponding to a specific blood bag 105 is read by the dosimeter reader 117.

The dosimeter reader 117 is placed at a suitable distance from the irradiation apparatus 113, as can depend on the use or application, such as typically at a maximum distance of up to 1 meter (m), from the irradiation apparatus 113, to receive the radiation dosage measured by the wireless dosimeter chip-enabled tags 101 associated with the specific blood bags 105 having the respective predetermined ID values. The dosimeter reader 117 can store or can read out, such as wirelessly through the antenna 119 or through a wired connection, the information or data in the respective received backscatter signals 109 from the corresponding wireless dosimeter chip-enabled tags 101, such as the measured radiation dose respectively applied to blood in the specific blood bags 105, or other applicable data for the blood in the specific blood bag 105, such as the temperature of the blood irradiated, time of irradiation or other applicable information or data, for example.

The exemplary 2.45 GHz X-ray wireless dosimeter chip-enabled tag 101 is intended to replace or is a substitute for the aforementioned color indicator RadTag labels. The 2.45 GHz wireless dosimeter chip-enabled tag 101 is typically used as a semi-passive RFID tag employing backscatter modulation and wireless power transfer to facilitate minimal power consumption and a low-form factor. The wireless dosimeter chip-enabled tag 101 associated with embodiments of the antenna 102 desirably includes an energy harvesting unit, such as a rectifier and a capacitor-for self-powered operation.

Also, embodiments of the wireless dosimeter chip-enabled tag 101 include a suitable wireless X-ray dosimeter chip-enabled tag sensor, such as embodiments of a low-power FG-MOSFET sensor in RF-CMOS technology, to be further described, which sense the received radiation dosage to the blood bag 105, signal processing electronics, such as a suitable processor and associated memory, that convert measured data to pulses and a transmitter or modulator that sends the pulses through the antenna 102 to the dosimeter reader 117 operating in the same frequency band. Similar to the RadTag labels, the wireless dosimeter chip-enabled tags are to be applied to the blood bags 105 as schematically depicted in FIG. 1. The wireless dosimeter chip-enabled tags 101 desirably are configured to communicate with the RF reader, such as the dosimeter reader 117, typically at a maximum distance of one meter for blood irradiation measurements, for example. Also, it is desirable that power consumption of the wireless dosimeter chip-enabled tag 101 is estimated to consume a power of 263 microwatts ($\mu$W) with a nominal supply of 1.2 volts (V), for example, although the power consumed can depend on the use or application, and should not be construed in a limiting sense.

Figure 2:
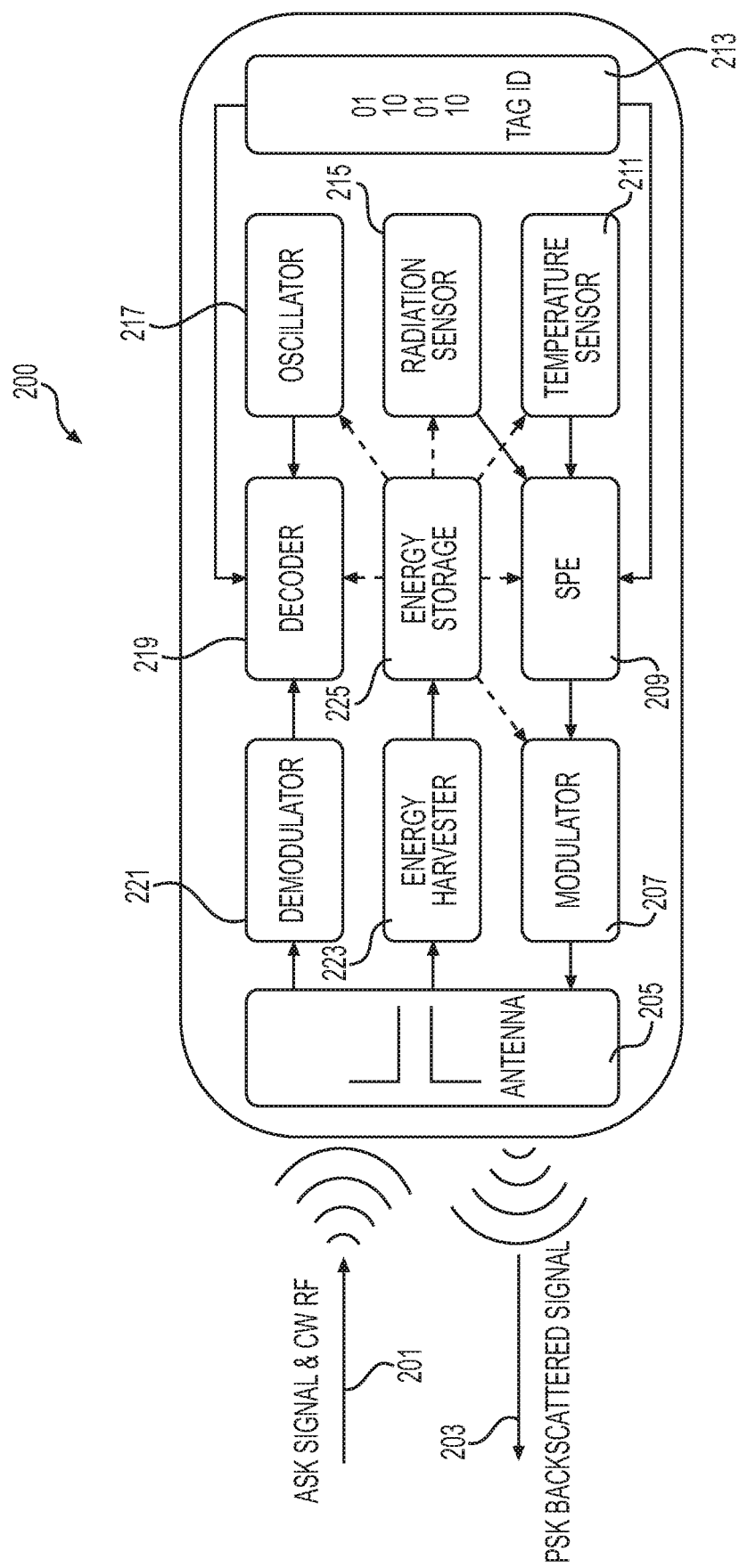
FIG. 2 is a system-level diagram illustrating an embodiment of a wireless dosimeter chip-enabled tag having a predetermined ID value associated with a flexible antenna and the sub-modules of the wireless dosimeter chip-enabled tag, according to the present invention.

FIG. 2 is a system-level diagram illustrating an embodiment of a wireless dosimeter chip-enabled tag 101 having a predetermined ID value associated with an embodiment of a low-power FG-MOSFET sensor in RF-CMOS technology and other sub-modules of the wireless dosimeter chip-enabled tag 101. In the exemplary embodiment of FIG. 2, there is illustrated the system-level diagram of a RFID wireless dosimeter chip-enabled tag 200 and its sub-modules, as an exemplary embodiment of the wireless dosimeter chip-enabled tag 101, and as implemented in a 130 nanometer (nm) complementary metal oxide semiconductor (CMOS) process, for example. The dosimeter of the RFID wireless dosimeter chip-enabled tag 200 is realized in a semi-passive RFID (radio frequency identification) tag configuration employing backscatter and a wireless RF energy harvesting module for low-power operation and low-form factor.

The wireless dosimeter chip-enabled tag 200 is uniquely identified by an ID value which is desirably hard-coded into the tags integrated circuit (IC). The wireless dosimeter chip-enabled tag 200 includes an antenna 205 to receive an ASK signal 201 and to transmit a PSK backscattered signal 203. The ASK signal 201, such as a constant wave radio frequency (CW RF) signal, is transmitted via the antenna 205 to a demodulator 221 to demodulate the received ASK signal 201 and is coupled with a decoder 219 to decode the received ASK signal 201 and an oscillator 217 to generate signals for operation of the wireless dosimeter chip-enabled tag 200. The decoder 219 is in communication with a Tag ID 213, which includes a unique or predetermined ID value associated with the wireless dosimeter chip-enabled tag 200. The TAG ID 213 is in communication with a signal processing engine (SPE) 209, or other suitable processor, including or associated with a memory for programs, instructions or data storage for operation and control of the wireless dosimeter chip-enabled tag 200, such for processing, transmitting or receiving requests, data or information in or by the wireless dosimeter chip-enabled tag 200. The SPE 209 is coupled to a modulator 207 which modulates and formats an information or data signal, such as the PSK backscatter signal 203, for transmission from the antenna 205 to a receiver, such as to the dosimeter reader 117.

The wireless dosimeter chip-enabled tag 200 further desirably includes a temperature sensor 211 to sense the temperature of an object, fluid or other medium associated with the wireless dosimeter chip-enabled tag 200, such as blood in the blood bag 105 being irradiated, an energy harvester 223 which harvests the energy from the received ASK signal 201 which is in communication with an energy storage module 225 to store the energy from the received ASK signal 201, which is in turn in communication with a low-power FG-MOSFET radiation sensor 215 in RF-CMOS technology, embodiments of which are further described, that sense an amount of radiation delivered to an object, such as blood in the blood bag 105.

The components of the wireless dosimeter chip-enabled tag 200 are communicatively associated with each other through the SPE 209 to perform the functions and operations of the wireless dosimeter chip-enabled tag 200, such as to determine an amount of radiation delivered to the blood bag 105. The wireless dosimeter chip-enabled tag 200 can be modified to perform other applications, as can utilize similar components to those described and additional components for such other applications, for example. To communicate with a specific wireless dosimeter chip-enabled tag 200, a reader, such as the dosimeter reader 117, transmits the ASK signal 201, such as an ultra-high frequency (UHF) 2.45 GHz ASK-modulated signal 201, containing the unique or predetermined ID value of the wireless dosimeter chip-enabled tag 200 it wishes to interrogate for data or information, such as the amount of radiation delivered to blood in a specific blood bag 105, for example.

For example, each wireless dosimeter chip-enabled tag 200, such as the wireless dosimeter chip-enabled tag 101 inside the irradiation apparatus 113, such as the Raycell Mk2 irradiator, demodulates the RF signal received through the antenna 205 and compares the received ID value to its own unique or predetermined ID value. If the ID values match, the wireless dosimeter chip-enabled tag 200 transmits its predetermined ID value from the tag ID 213, a sensed X-ray dose from the radiation sensor 215, and measured temperature from the temperature sensor 211 through the antenna 205 to a receiver, such as the dosimeter reader 117, using backscatter modulation. For example, the dosimeter reader 117 establishes a backscatter link by broadcasting a 2.45 GHz CW carrier tone as the ASK signal 201. During uplink communication, the specified wireless dosimeter chip-enabled tag 200 modulates its data, such as radiation, temperature and the predetermined ID value, onto this CW carrier signal using PSK modulation, and reflects the signal as the PSK backscattered signal 203 back to the dosimeter reader 117. Desirably, the interrogation of the wireless dosimeter chip-enabled tag 200 and the transmission and reception communications are carried out using the antenna 205 operating at 2.45 GHz, for example. Examples of a suitable antenna 205 are described in Sansui et al., "Development of a 2.45 GHz Antenna for Flexible Compact Radiation Dosimeter Tags", IEEE Transactions on Antennas and Propagation", Apr. 16, 2019.

Figure 3:
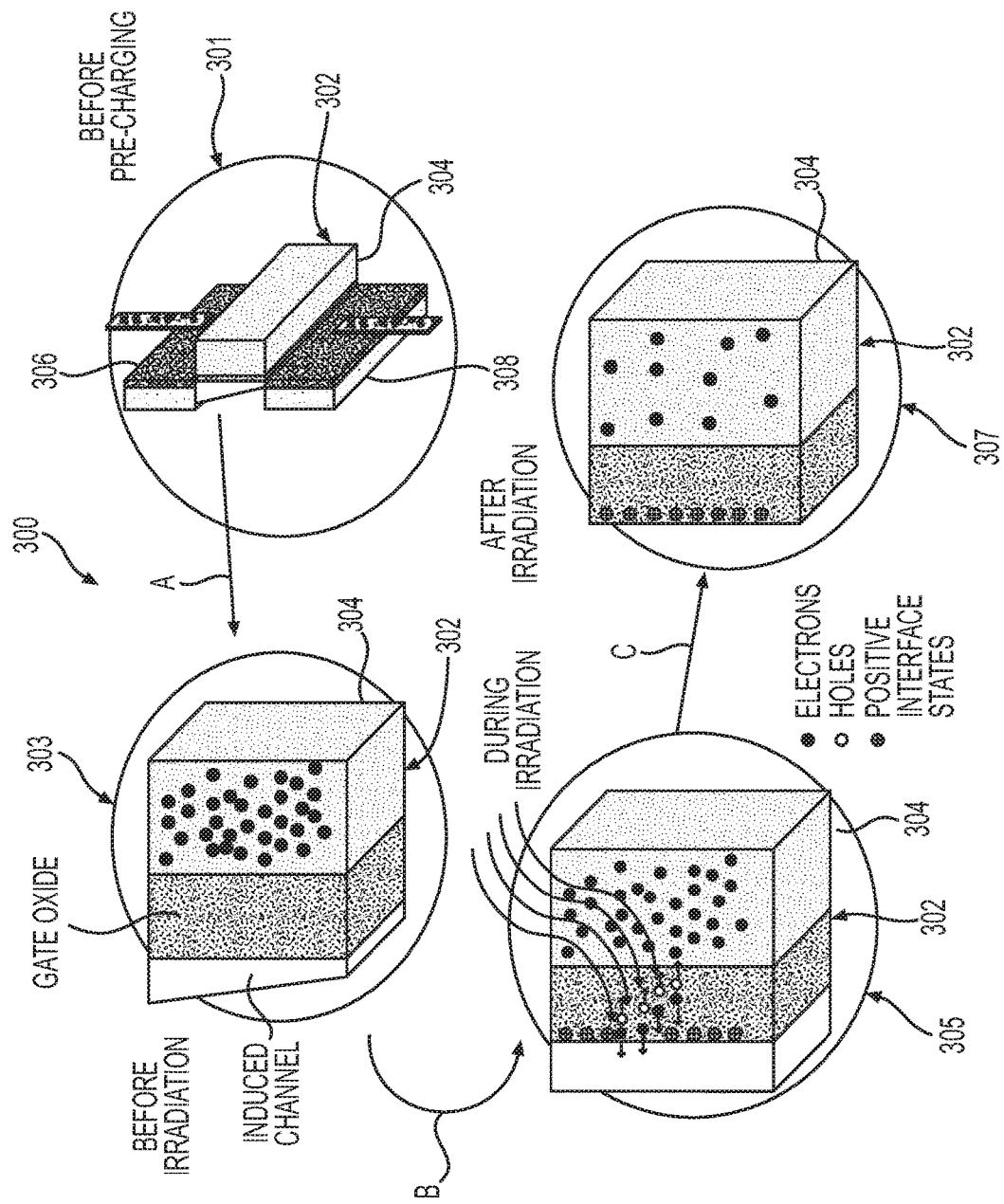
FIG. 3 shows a diagrammatic illustration of the process of pre-charging and sensing a radiation dose delivered to an embodiment of an FG-MOSFET sensor, according to the present invention.

FIG. 3 shows a diagrammatic illustration of a process 300 of pre-charging and sensing a radiation dose delivered to an embodiment of an FG-MOSFET sensor, according to the present invention.

Referring to FIG. 3, the process 300 diagrammatically illustrates various states in the irradiation of embodiments of a floating gate MOS sensor (FG-MOSFET) sensor 302, namely a pre-charging state 301 before a radiation dose is applied to the floating gate MOS sensor (FG-MOSFET) sensor 302, a charging state 303 before irradiation of the floating gate MOS sensor (FG-MOSFET) sensor 302, an irradiation state 305 during irradiation of the floating-gate MOS sensor (FG-MOSFET) sensor 302, and an after irradiation state 307 of the floating gate MOS sensor (FG-MOSFET) sensor 302. The arrows A, B and C indicate a transition to the various states in the process 300, the arrow A indicating a transition from the pre-charging state 301 to the charging state 303, the arrow B indicating a transition from the charging state 303 to the irradiation state 305 and the arrow C indicating a transition from the irradiation state 305 to the after irradiation state 307, for example.

Embodiments of the FG-MOSFET sensor 302 are fabricated by 0.13 μm RF-CMOS process, such as a commercially available 0.13 μm RF-CMOS process of Global Foundries. The 0.13 μm RF-CMOS process enables providing a relatively thin oxide layer for embodiments of the FG-MOSFET sensor 302 that advantageously facilitates incorporation of the FG-MOSFET sensor 302 in a wireless radiation dosimeter, such as the wireless dosimeter chip-enabled tag 200, for example.

The FG-MOSFET sensor 302 is the heart of the wireless dosimeter system, such as of the dosimeter chip enabled tag 200, since it measures the exact cumulative X-ray or gamma ray radiation exposure. Its principle of operation relies on the generation of charge carriers (electrons and holes) in the device's oxide layer due to ionizing radiations. Mechanisms for the generation of charge carriers are described herein, and, sensitivity of the sensors generally increases with oxide thickness. The reduction in the number of charges placed on the floating gate prior to irradiation as per ionizing radiation results in the change in the drain current. Thus, it is the output drain current magnitude, $I_{DS}$, that is indicative of the radiation intensity.

However, as further described, the thick oxides of known sensors can be difficult to implement on a wireless dosimeter integrated circuit chip and for low power applications, such as for wireless dosimeters, and, thus, a relatively thin oxide solution is needed for such wireless radiation measurement. To facilitate use of embodiments of the FG-MOSFET sensor 302 for a wireless dosimeter chip, as described herein, embodiments of the FG-MOSFET sensor 302 are fabricated by a commercially available 0.13 μm CMOS process, to provide a relatively low cost sensor having a relatively thin oxide layer making such thin oxide sensors suitable for wireless dosimeter radiation measurement. RF-CMOS is a unique technology in that it possesses extremely thin gate oxide layers for efficient RF operation. However, such thin oxide FG-MOSFET sensor, such as manufactured using a 0.13 μm CMOS process, makes RF-CMOS an unnatural choice for X-ray dosimetry, which conventionally relies on thicker oxides. The thicker oxide prevents charge leakage out of the floating gate.

As illustrated, the FG-MOSFET sensor 302 has a floating gate 304, a drain 306 and a source 308. From the pre-charging state 301 to the charging state 303 indicated by the arrow A, initially the floating gate of the FG-MOSFET sensor 302 is pre-charged at pre-charging state 303 with excess charge using a series of pulses, such as desirably negative pulses of ≈−7 Volts (V), from an external source. Before irradiation, the pre-charging of the FG-MOSFET sensor 302 with the ionizing irradiation creates electron-hole pairs inside the thin oxide layer formed under the floating gate extension. The generated electrons and holes are separated from each other due to the electric field that exists within the deep oxide formation. From the charging state 303 the process 300 proceeds to the irradiation state 305, as indicated by the arrow B. In the irradiation state 305, the electrons from the floating gate 304 recombine with the generated holes that are attracted to them as illustrated in the after irradiation state 307 as the process 300 proceeds from the irradiation state 305 to the after irradiation state 307, indicated by the arrow C.

Another mechanism is that the excess electrons on the floating gate 304 receive enough energy from the incident X-ray photons so that they could escape the floating gate 304. Moreover, the dielectric layer on top of and around the floating gate extension contributes holes generated by ionizing radiation, which in turn recombine with the excess electrons. These three main mechanisms cause a reduction of charge inside the floating gate 304 which is reflected in the output current. As discussed further herein, by sensing this change in the current value, the cumulative incident radiation on the FG-MOSFET sensor can be determined. A reference radiation dosimeter, such as an ion chamber, can be used to determine the actual amount of ionizing radiation as a reference for the dose delivered. The change in the drain-source current $I_{DS}$ for the FG-MOSFET device 302 is then taken as a secondary measurement with respect to a reference device, as further discussed, to determine the dose delivered to the FG-MOSFET device 302. Use of the change in the drain-source current $I_{DS}$ in measuring the irradiation dose delivered facilitates use of embodiments of a thin film FG-MOSFET sensor, such as those described, in an integrated circuit chip wireless dosimeter, for wireless dosimeter measurement of the radiation dose delivered.

Figure 4:
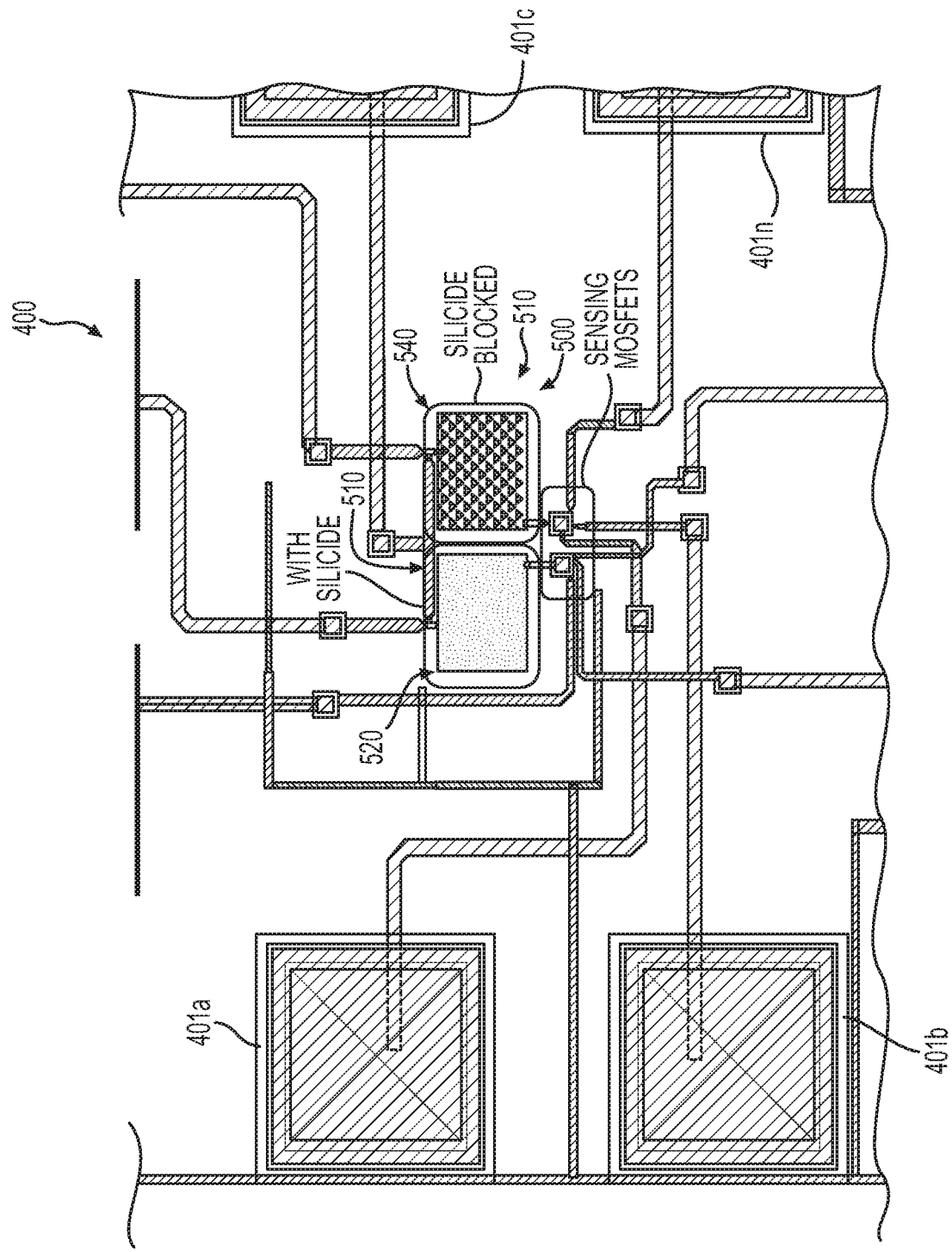
FIG. 4 shows a schematic of an integrated circuit chip layout illustrating embodiments of FG-MOSFET sensors with and without a silicide blocked or passivation layer, according to the present invention.

FIG. 4 shows a schematic top view of an integrated circuit chip layout 400 illustrating embodiments of an FG-MOSFET sensor pair 500 for irradiation dose measurement. The integrated circuit chip layout 400 generally indicates that for the wireless dosimeter chip-enabled tag 200, such as having the components previously described for the wireless dosimeter chip-enabled tag 200, the components the wireless dosimeter chip-enabled tag 200 generally indicated by the numbers 401a, 401b, 401c and 401n, for example, in the integrated circuit chip layout 400 of FIG. 4. The matched FG-MOSFET sensor pair 500, to be further described with reference to FIG. 5, includes a first FG-MOSFET sensor 520 of the matched FG-MOSFET sensor pair 500 having a salicide layer or a silicide layer, as a FG-MOSFET lower sensitivity sensor 520, and a second FG-MOSFET sensor 540 of the matched FG-MOSFET sensor pair 500, as a FG-MOSFET higher sensitivity sensor 540, desirably not having a salicide layer or a silicide layer or passivation layer, i.e. silicide-blocked configuration, the MOSFET higher sensitivity sensor 540 having a higher sensitivity $S_1$ (A/cGy) than a sensitivity $S_2$ (A/cGy) of the FG-MOSFET lower sensitivity sensor 520. The FG-MOS device of the FG-MOSFET sensor pair 500 has the FG-MOSFET lower sensitivity sensor 520 having a silicided or salicided polysilicon gate extension and has the FG-MOSFET higher sensitivity sensor 540 having the silicide deposition blocked.

The embodiment of the FG-MOSFET sensor pair 500 of FIG. 4 illustrates FG-MOSFET sensors in the RF-CMOS process for use in a wireless radiation dosimeter, such as for measurement of radiation delivered to blood, for example. The embodiment of a FG-MOSFET sensor pair 500 of FIG. 4 is desirably fabricated in a low cost, commercially CMOS process, desirably a 0.13 µm RF-CMOS process. The FG-MOSFET sensor structure of the FG-MOSFET sensor pair 500, such as for measurement of radiation, is unlike conventional FG-MOSFET sensors, in that it possesses extremely thin gate oxide layers for efficient RF operation, and facilitates its monolithic integration in a wireless dosimeter chip enabled tag. Such thin oxide in the FG-MOSFET sensor makes RF-CMOS an unnatural choice for X-ray dosimetry, which conventionally relies on thicker oxides, which thicker oxide prevents charge leakage out of the floating gate.

Figure 5:
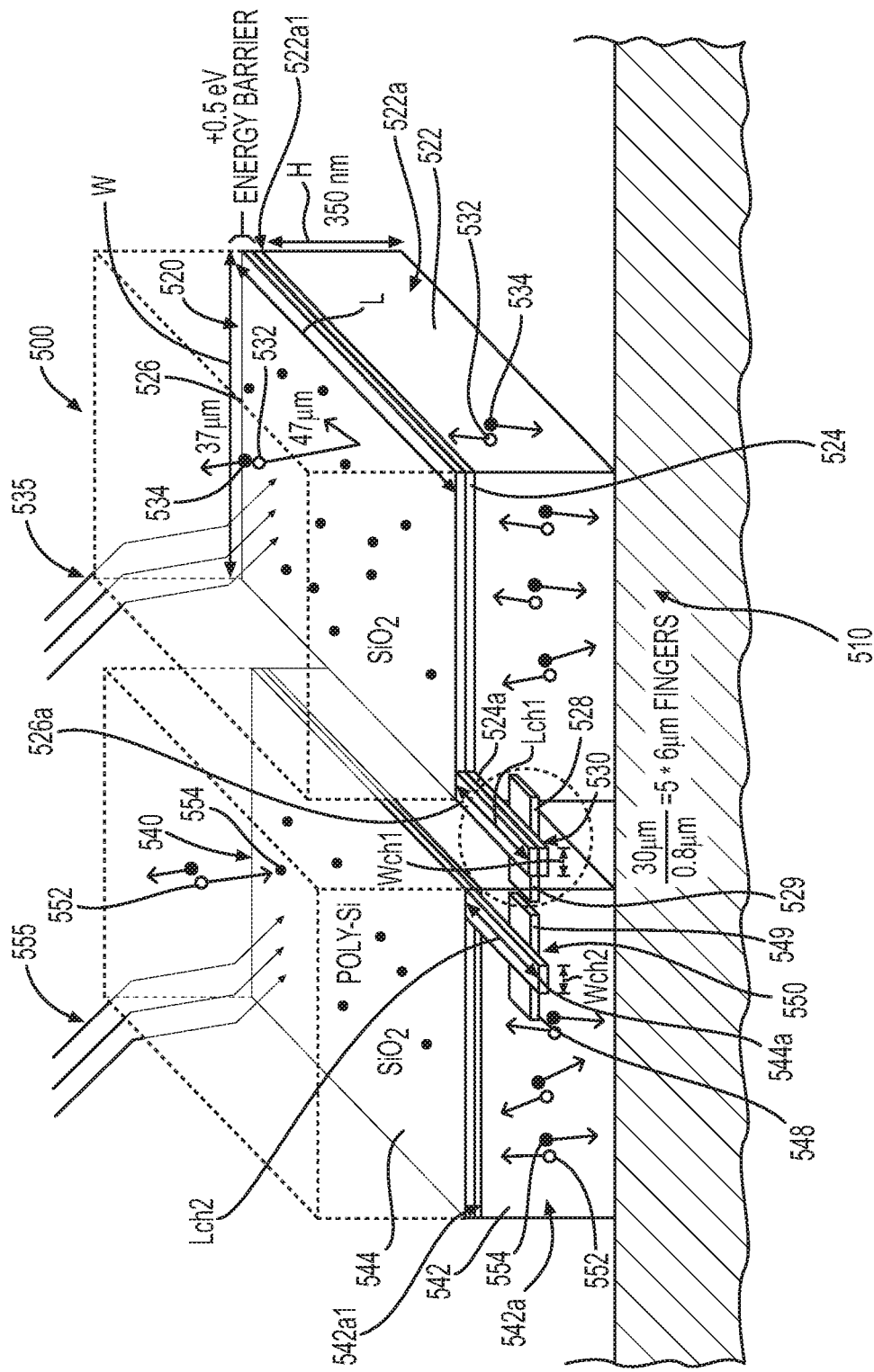
FIG. 5 shows embodiments of FG-MOSFET sensors, including an embodiment of a FG-MOSFET lower sensitivity sensor with a silicide or passivation layer and also a FG-MOSFET higher sensitivity sensor without a silicide or passivation layer, i.e. silicide blocked, providing a matched FG-MOSFET sensor pair for wireless radiation, according to the present invention.

FIG. 5 shows embodiments of FG-MOSFET sensors, including an embodiment of the FG-MOSFET lower sensitivity sensor 520 with a salicide layer or a silicide layer or a passivation layer and also the FG-MOSFET higher sensitivity sensor 540 without a silicide or passivation layer, i.e. silicide blocked, providing the matched FG-MOSFET sensor pair 500 for wireless radiation, according to the present invention.

Referring to FIG. 5, a dual sensitivity radiation sensor, includes a matched FG-MOSFET sensor pair 500 including a FG-MOSFET lower sensitivity sensor 520, manufactured by a 0.13 µm RF-CMOS process, and a FG-MOSFET higher sensitivity sensor 540, also manufactured by a 0.13 µm RF-CMOS process, on a common substrate 510, the FG-MOSFET sensor pair 500 are desirably PMOS FG devices, for example. FIG. 5 illustrates the layout of the two devices in the FG-MOSFET sensor pair 500, the FG-MOSFET lower sensitivity sensor 520 and the FG-MOSFET higher sensitivity sensor 540 with desirable identical or approximately identical dimensions of active and extension regions. The FG-MOSFET lower sensitivity sensor 520 includes a relatively thin oxide layer 522 forming a device well region 522a of or on the substrate 510. The device well region 522a includes a shallow trench isolation (STI) 522a1 from the 0.13 µm RF-CMOS process and is associated with a source 529 and a drain 528 separated by a channel region 530. The FG-MOSFET lower sensitivity sensor 520 has a gate oxide 526a overlying the channel region 530 and a floating gate 524a are formed thereon. The FG-MOSFET lower sensitivity sensor 520 further includes a floating gate extension 524 communicating with the floating gate 524a and extending over the shallow trench isolation (STI) 522a1 from the 0.13 µm RF-CMOS process in an adjacent field dielectric region formed by the relatively thin oxide layer 522. The FG-MOSFET lower sensitivity sensor 520 further includes a corresponding charge injector means pre-charger 537 (FIG. 9) associated with the floating gate extension 524. The FG-MOSFET lower sensitivity sensor 520 also includes a silicide layer or a self-aligned silicide (salicide) layer 526 overlying the floating gate extension 524 and the floating gate 524a. Desirably, a shielding metal layer 548 (FIG. 9) overlies the floating gate 524a and the floating gate extension 524, to be described. Also, the FG-MOSFET lower sensitivity sensor 520 is desirably constructed to provide an energy barrier of or approximately +0.5 electron volts (eV) through the floating gate extension 524 and the self-aligned silicide (salicide) layer 526, for example, to facilitate efficient operation of the FG-MOSFET lower sensitivity sensor 520 in the measurement of radiation dose, as further described. As seen in FIG. 5, charges of electrons 534 and holes 532 are generated in regions of the relatively thin oxide layer 522 and the floating gate extension 524 as per ionizing radiation 535, and the holes 532 are attracted to and the electrons 534 are repelled from the floating gate extension 524 region, during irradiation from an irradiation source, such as the Faxitron or the Raycell MK2 irradiator, which provides the channel current $I_{DS}$ used in the dose measurement.

Continuing with reference to FIG. 5, the FG-MOSFET higher sensitivity sensor 540 includes a relatively thin oxide layer 542 forming a device well region 542a of or on the substrate 510. The device well region 542a includes a shallow trench isolation (STI) 542a1 from the 0.13 μm RF-CMOS process and is associated with a source 549 and a drain 548 separated by a channel region 550. The FG-MOSFET higher sensitivity sensor 540 also includes a floating gate 544a formed on the channel region 550. The FG-MOSFET higher sensitivity sensor 540 further includes a floating gate extension 544 communicating with the floating gate 544a and extending over the shallow trench isolation (STI) 542a1 from the 0.13 μm RF-CMOS process in an adjacent field dielectric region formed by the relatively thin oxide layer 542. However, the FG-MOSFET higher sensitivity sensor 540, unlike the FG-MOSFET lower sensitivity sensor 520, desirably does not have a silicide layer or a salicide layer formed over the floating gate extension 544 and the floating gate 544a, as to be further described. The silicide layer or salicide layer of the FG-MOSFET lower sensitivity sensor 520 is automatically implanted on any poly-silicon layer on chip to reduce its resistance since the gate is used to route signal in short distances on chip. This compound layer is electrically conductive and reflective which could contribute to the degradation of radiation sensing of lower energy X-ray photons due to reflection and scattering. In this regard the FG-MOSFET higher sensitivity sensor 540 desirably does not include such salicide layer, silicide layer or passivation layer, to enhance its efficiency and use in wireless dosimeter measurements.

Further, as seen in FIG. 5, similar to the charge generation in the FG-MOSFET lower sensitivity sensor 520, charges of electrons 554 and holes 552 are generated in the FG-MOSFET higher sensitivity sensor 540 in regions of the relatively thin oxide layer 542 and the floating gate extension 544 as per ionizing radiation 555, and the holes 552 are attracted to and the electrons 554 are repelled from the floating gate extension 544 region, during irradiation from an irradiation source, such as the Faxitron or the Raycell MK2 irradiator, which provides the channel current $I_{DS}$ used in the dose measurement.

Also, the FG-MOSFET higher sensitivity sensor 540 further includes a corresponding charge injector means pre-charger 557 (FIG. 9) associated with the floating gate extension 544, but desirably does not include a self-aligned silicide (salicide) layer or a silicide layer, overlying the floating gate extension 544 and the floating gate 544a. Desirably, a shielding metal layer 558 (FIG. 9) overlies the floating gate 544a and the floating gate extension 544, to be described.

FIG. 5 illustrates the layout of the two devices in the FG-MOSFET sensor pair 500 with desirably identical or approximately identical dimensions of active and extension regions, such as illustrated in FIG. 5. The matched FG-MOSFET sensor pair 500 including the FG-MOSFET lower sensitivity sensor 520 and the FG-MOSFET higher sensitivity sensor 540 and all their respective layers and dimensions are desirably identical or approximately identical in size and placement within the three-dimensional volume of the wireless dosimeter chip, such as within the wireless dosimeter chip-enabled tag 200, for example. In the matched FG-MOSFET sensor pair 500 including the FG-MOSFET lower sensitivity sensor 520 and the FG-MOSFET higher sensitivity sensor 540, each of the FG-MOSFET lower sensitivity sensor 520 and the FG-MOSFET higher sensitivity sensor 540 desirably have respective channel widths, Wch1 and Wch2, and channel lengths, Lch1 and Lch2 for the respective channel regions 530 and 550 that are substantially identical. For example, the respective channel widths Wch1 and Wch2 of the channel regions 530 and 550 of the FG-MOSFET lower sensitivity sensor 520 and the FG-MOSFET higher sensitivity sensor 540 desirably are each of or approximately 30 μm. The respective channel lengths Lch1 and Lch2 of the channel regions 530 and 550 of the FG-MOSFET lower sensitivity sensor 520 and the FG-MOSFET higher sensitivity sensor 540 desirably are approximately 0.8 μm, for example.

Also, as illustrated in FIG. 5, the respective widths W of the FG-MOSFET lower sensitivity sensor 520 and the FG-MOSFET higher sensitivity sensor 540 are each of or approximately 37 μm. The respective lengths L of the FG-MOSFET lower sensitivity sensor 520 and the FG-MOSFET higher sensitivity sensor 540 are each of or approximately 47 μm, for example. Additionally, the respective heights H of the relatively thin oxide layer 522 forming the device well region 522a of the FG-MOSFET lower sensitivity sensor 520 and the relatively thin oxide layer 542 forming a device well region 542a of the FG-MOSFET higher sensitivity sensor 540 are each of or approximately 350 nm, for example. As to be discussed further with respect to FIG. 14, the channel regions 530 and 550 are each formed of a plurality of fingers, such as five fingers of approximately 6 μm each (30 μm/0.8 μm=5*6 μm fingers), for example, although a single finger or other suitable number of fingers can be used, as can depend on the use or configuration, for example. The various configurations and dimensions of the FG-MOSFET lower sensitivity sensor 520 and the FG-MOSFET higher sensitivity sensor 540 can be of any of various suitable dimensions and configurations, as can depend on the use or application, and should not be construed in a limiting sense.

Figure 6:
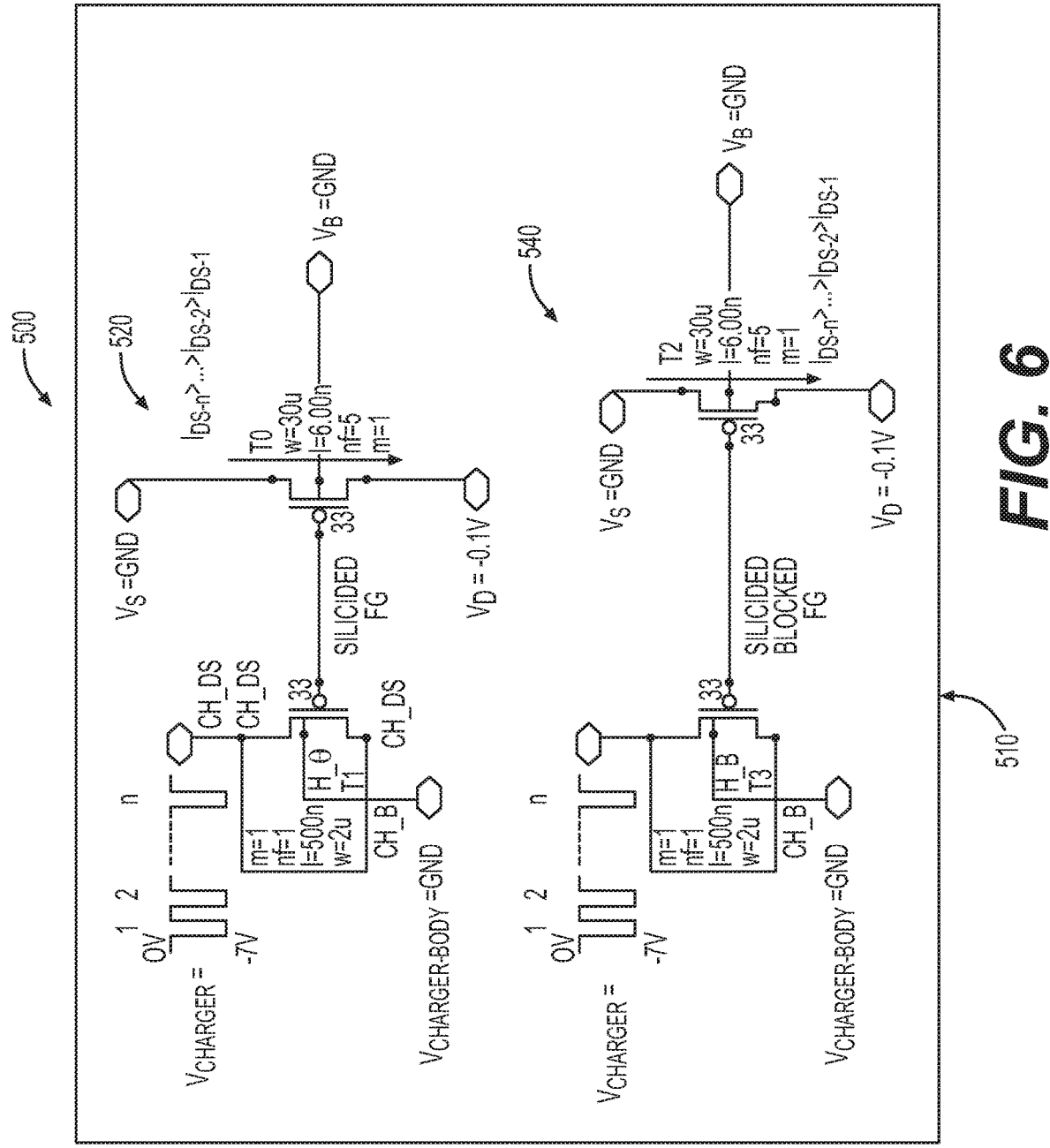
FIG. 6 shows circuit diagrams of embodiments of FG-MOSFET sensors with and without a silicide blocked or passivation layer, respectively, in conjunction with a pre-charging charge injector electrode illustrating charging pulses, voltages and currents associated with pre-charging of FG-MOSFET sensors with and without a silicide blocked or passivation layer, according to the present invention.

FIG. 6 shows exemplary circuit diagrams of embodiments of the FG-MOSFET sensors 520 and 540 of the matched FG-MOSFET sensor pair 500 including the FG-MOSFET lower sensitivity sensor 520 with a silicided floating gate (FG), manufactured by a 0.13 μm RF-CMOS process, and a FG-MOSFET higher sensitivity sensor 540, also manufactured by a 0.13 μm RF-CMOS process without a silicide layer or without a passivation layer (silicide-blocked), respectively, in conjunction with a pre-charging charge injector electrode illustrating charging pulses, voltages and currents associated with pre-charging of FG-MOSFET sensors 520 and 540, according to the present invention. Therefore, FIG. 6 shows the schematic of the silicide-blocked FG-MOS higher sensitivity sensor 540 and the FG-MOSFET lower sensitivity sensor 520 of the matched FG-MOSFET sensor pair 500.

As discussed herein, the matched FG-MOSFET sensor pair 500 including the FG-MOSFET sensors 520 and 540 illustrated in FIG. 6 have been irradiated under two different radiation sources to demonstrate the extent of the radiation sensitivity of the FG-MOS devices of the FG-MOSFET sensors 520 and 540 of the matched FG-MOSFET sensor pair 500 and their suitability for radiation dose measurement in wireless dosimeter measurement. The first test setup for generating radiation for the radiation sensitivity measurements was a "Faxitron" X-ray source. The "Faxitron" device used was capable of producing X-rays in the approximate range of 5 kilo electron volts (keV) to 45 keV by adjusting the voltage range from 0 kV to 110 kV. The second X-ray source used for generating radiation for the radiation sensitivity measurements was a Raycell MK2 (2×160 kilovolts peak (kVp) X-ray tubes each with 25 mA) X-ray source, as a radiation source, equipped with two X-ray lamps operating at 160 kVp placed vertically on top of and under the plastic canister (container) which in normal use contains blood bags. The Raycell MK2 device used does not produce monochromatic X-ray photons, but rather a photon spectrum of 60 keV to 80 keV was the radiation produced. The voltage bias used throughout the radiation dose delivery measurements was kept consistently at or approximately $V_{DS}$=0.1 V, for example.

In demonstrating the extent of the radiation sensitivity of the FG-MOS devices of the FG-MOSFET sensors 520 and 540 of the matched FG-MOSFET sensor pair 500 and their suitability for radiation dose measurement in wireless dosimeter measurement, the actual dose to the FG-MOSFET sensors 520 and 540 was not taken as a priority but, rather, the relative change in their characteristics of the FG-MOSFET sensors 520 and 540 within the duration of the irradiation session. Also, FG-MOSFET dosimeters typically need to be calibrated against a reference measurement device, such as an ion chamber, before being exposed to radiation if they are to be used as a radiation sensor and FG-MOS radiation sensitivity has been determined in terms of the shift in the threshold voltage.

However, without determining radiation dose in terms of the shift in the threshold voltage, embodiments of the thin-oxide FG-MOSFET lower sensitivity sensor 520 and thin-oxide FG-MOSFET higher sensitivity sensor 540 of the matched FG-MOSFET sensor pair 500 can enable a dual sensitivity measurement of radiation dose delivered by using or measuring the channel current $I_{DS}$ for each of the thin-oxide FG-MOSFET lower sensitivity sensor 520 and the thin-oxide FG-MOSFET higher sensitivity sensor 540 at a given time of duration of radiation dose delivery which correlates to a sensitivity difference at the given time of a measure of the radiation dose delivered or the radiation effect of the delivered dose. The difference of the channel current, $I_{DS}$, between either the thin-oxide FG-MOSFET lower sensitivity sensor 520 and the thin-oxide FG-MOSFET or the higher sensitivity sensor 540, and a reference FG-MOSFET device (not shown), at a radiation duration time T gives an accurate reading of dose applied to a product or object, such as to a blood bag, for example.

Measurement of current change as a result of radiation exposure is typically dependent on the MOSFET width and length dimensions, whereas threshold voltage shift is a unique characteristic of a MOSFET regardless of its dimensions. However, with regards to the use of the shift in the threshold voltage as a measure of radiation dose, two issues can be present, namely fabrication technologies typically are not substantially identical in intrinsic characteristics such as a threshold voltage, $V_{TH}$, to make them meaningfully comparable, and threshold voltage change as a result of irradiation is typically only applicable to gate-connected thick gate oxide older variants of MOS technologies in which permanent radiation damage in the gate oxide was responsible for this shift in the threshold voltage. Such thick gate oxide MOS technologies are generally not suitable for use with integrated circuit wireless dosimeter chips, given the low power requirements and relatively thin dimensions required for sensors for integration with the wireless dosimeter chips.

As with the well-known electrically erasable programmable read-only memory (EEPROM) technology used for non-volatile memory (NVM) applications, the state ('0' or '1') of a charged or a discharged floating gate MOS cell is determined by passing a current through the channel and converting that to a voltage through a sense amplifier stage. Accordingly, the channel currents measured are used to draw conclusions which satisfy the objectives of the thin-oxide FG-MOSFET lower sensitivity sensor 520 and the thin-oxide FG-MOSFET higher sensitivity sensor 540 being used for low power wireless dosimeter radiation measurement. Using radiation generated by the Faxitron and Raycell MK2 devices, the experimental results of the irradiation of embodiments of three variants of FG-PMOS sensors 520 and 540, namely those without a silicide blocked or passivation layer, those with and without a metal protection layer and those having a single finger and a plurality of fingers forming the channel regions 530 and 550 are described.

Figure 7:
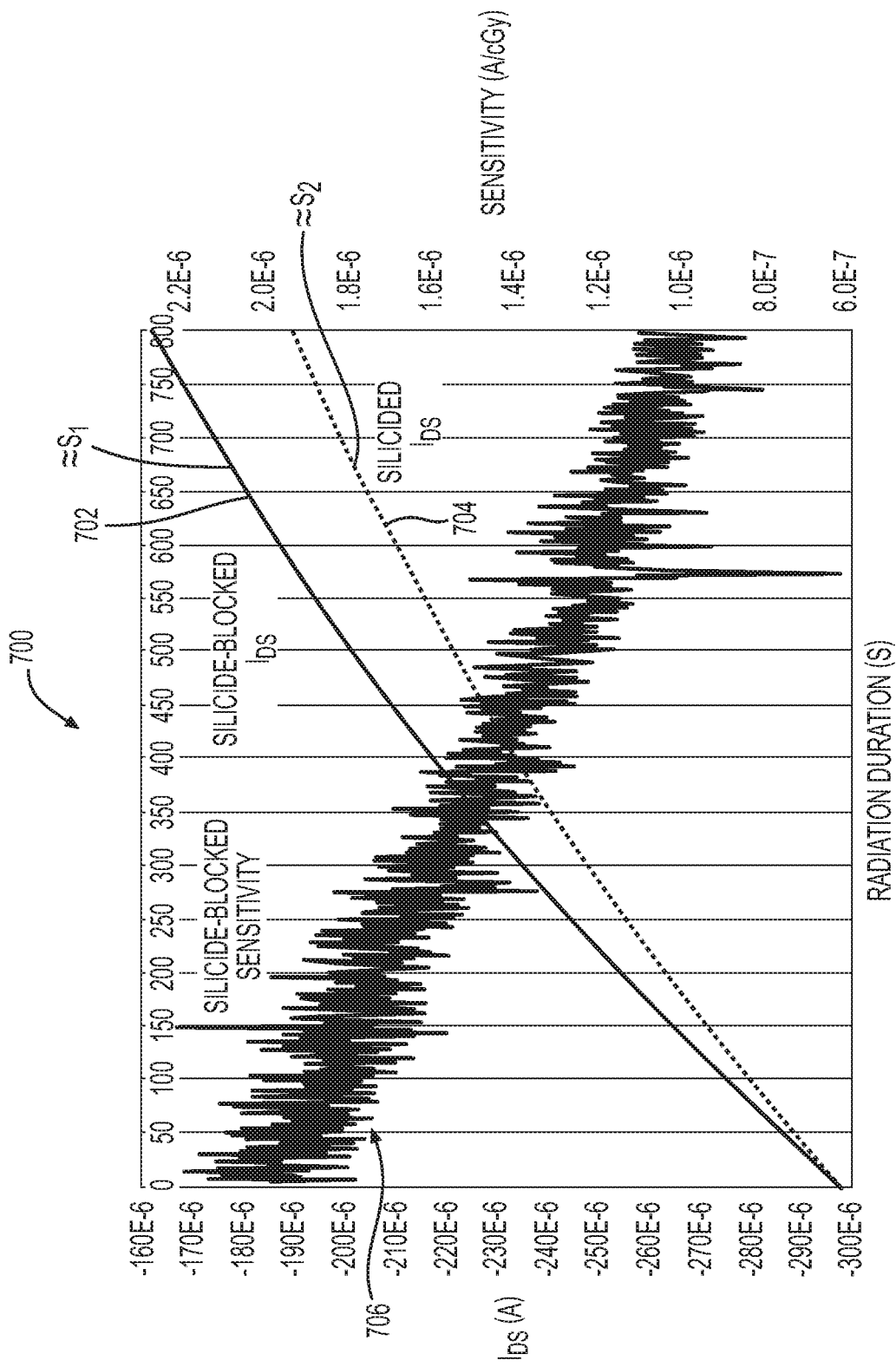
FIG. 7 is a graphic illustration of the discharge of the floating gate of embodiments of FG-MOSFET sensors with and without a silicide blocked or passivation layer under radiation of 110 kVp, according to the present invention.

FIG. 7 is a graphic illustration 700 of the discharge of the floating gate of embodiments of FG-MOSFET sensors 520 and 540 with and without a silicide blocked or passivation layer under radiation of 110 kVp, using the Faxitron as the radiation source. The graphic illustration 700 of FIG. 7 illustrates the drain source channel current $I_{DS}$ in amperes (A) measured over a radiation duration time T measured in seconds (s) correlated with sensitivity (S) at a corresponding radiation duration time T measured in Amperes/centiGray (A/cGy), with the discharge of the floating gate under radiation at 110 kVp using the Faxitron device at an corresponding energy 45 keV, as described. In FIG. 7, a curve plot 702 of the channel current $I_{DS}$ (A) and sensitivity $S_1$ for radiation duration time T for the silicide-blocked (un-silicided) FG-MOSFET higher sensitivity sensor 540, a curve plot 704 of the channel current $I_{DS}$ (A) and sensitivity $S_2$ for radiation duration time T for the silicided FG-MOSFET lower sensitivity sensor 520 and a plot 706 of the silicide-blocked sensitivity S for the silicide-blocked (un-silicided) FG-MOSFET higher sensitivity sensor 540, are illustrated.

From the graphic illustration 700, a significant difference in sensitivity is observed between the silicide-blocked FG-MOSFET higher sensitivity sensor 540 and the silicided FG-MOSFET lower sensitivity sensor 520 of otherwise identical or substantially identical properties. This difference in sensitivity is reflected through the difference in floating gate discharge rates which in turn is reflected by a change in the channel current $I_{DS}$. Both the devices of the silicide-blocked FG-MOSFET higher sensitivity sensor 540 and the silicided FG-MOSFET lower sensitivity sensor 520 were biased at −0.1 V. From FIG. 7, it can be seen that the un-silicided version FG-MOSFET higher sensitivity sensor 540 has a higher sensitivity $S_1$ than the sensitivity $S_2$ of the silicided FG-MOSFET lower sensitivity sensor 520. At the 800th second, the silicide-blocked device, the un-silicided version FG-MOSFET higher sensitivity sensor 540, shows approximately 140 μA of reduction in channel current $I_{DS}$ compared to 110 μA for the silicided device, the silicided FG-MOSFET lower sensitivity sensor 520, for example.

As mentioned, and from FIG. 7, using or measuring the channel current $I_{DS}$ for each of the silicided thin-oxide FG-MOSFET lower sensitivity sensor 520 and un-silicided thin-oxide FG-MOSFET higher sensitivity sensor 540 at a given time of duration (T) of radiation dose delivery correlates to a dual measure of the dose delivered to an object or product, as sensed by the matched FG-MOSFET sensor pair 500. It has been found that the sensitivity differences of the unsilicided thin-oxide FG-MOSFET higher sensitivity sensor 540 ($S_1$) from the curve plot 702 and that of the silicided thin-oxide FG-MOSFET lower sensitivity sensor 520 ($S_2$) from the curve plot 704 at the given radiation duration time (T) correlates to the dual-sensitivity measurements of the radiation dose delivered (D) in centiGray (cGy) to an object or a product, such as a blood bag, at the given radiation duration time T. As noted, the difference of the channel current, $I_{DS}$, between either the thin-oxide FG-MOSFET lower sensitivity sensor 520 or the thin-oxide FG-MOSFET higher sensitivity sensor 540, and a reference FG-MOSFET (not shown), at a given radiation duration time T, as indicated on the sensitivity curves of the curve plots 702 and 704, respectively, gives a dual reading of dose applied to a product or object, such as to a blood bag, for example. Therefore, a radiation dose received by each of the FG-MOSFET sensors of the matched FG-MOSFET sensor pair 500 at the given radiation duration time T corresponds to the two sensitivities, $S_1$ and $S_2$, of the matched sensor pair.

Figure 8:
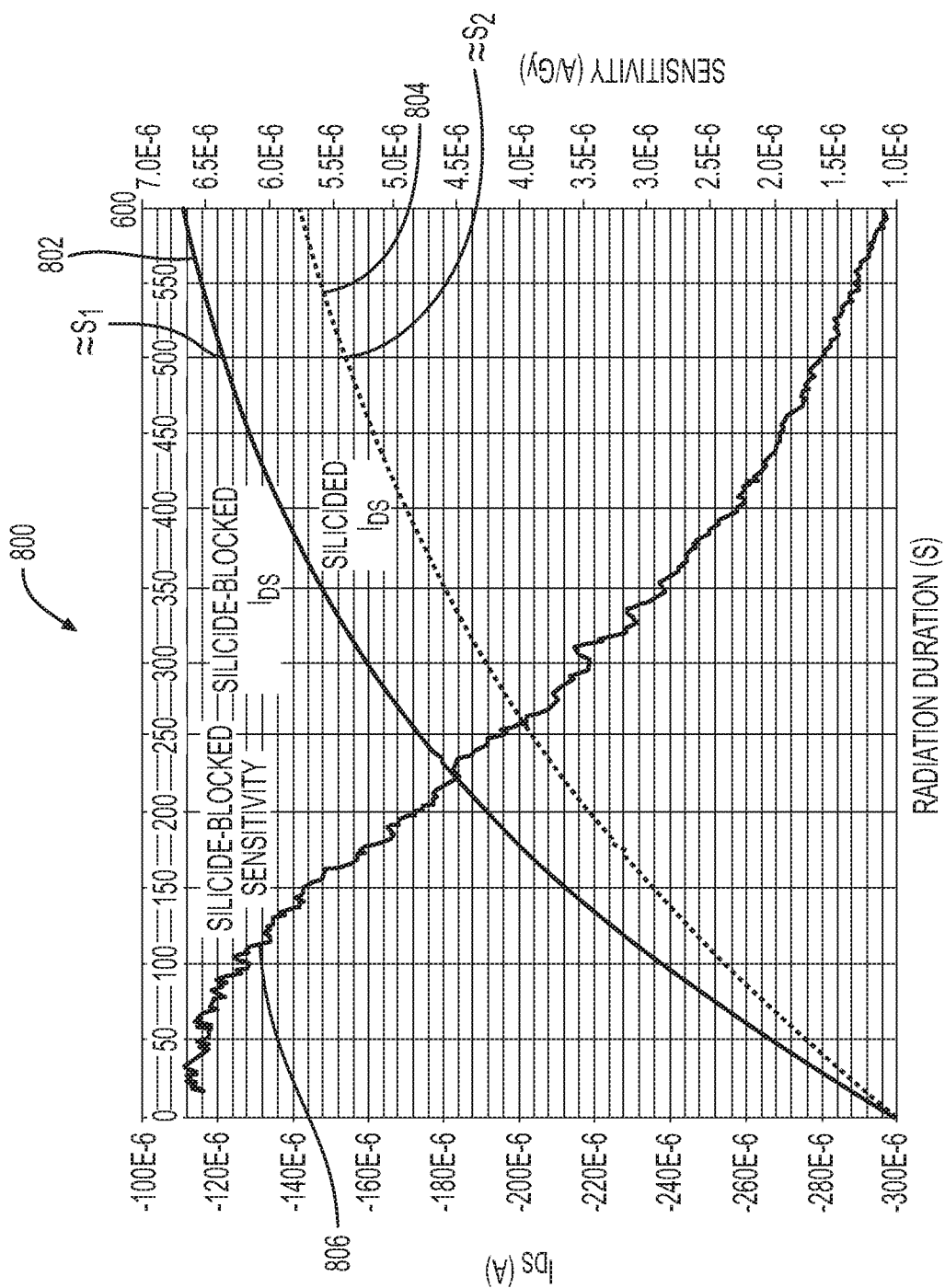
FIG. 8 is a graphic illustration of radiation exposure of embodiments of FG-MOSFET sensors with and without a silicide blocked or passivation layer on a single chip under radiation of 110 kVp, according to the present invention.

FIG. 8 is a graphic illustration 800 of the discharge of the floating gate of embodiments of FG-MOSFET sensors 520 and 540 with and without a silicide blocked under radiation of 2×160 kVp, using the Raycell MK2 as the radiation source. The graphic illustration 800 of FIG. 8, similar to that in FIG. 7, illustrates the drain source channel current $I_{DS}$ in amperes (A) measured over a radiation duration time T measured in seconds (s) correlated with sensitivity (S) at a corresponding radiation duration time (T), but measured in Amperes/Gray (A/Gy), with the discharge of the floating gate under radiation at 2×160 kVp using the Raycell MK2 device at a corresponding energy of 60 keV to 80 keV, as described. In FIG. 8, a curve plot 802 of the channel current $I_{DS}$ (A) and sensitivity $S_1$ for radiation duration time T for the silicide-blocked (un-silicided) FG-MOSFET higher sensitivity sensor 540, a curve plot 804 of the channel current $I_{DS}$ (A) and sensitivity $S_2$ for radiation duration time T for the silicided FG-MOSFET lower sensitivity sensor 520 and a plot 806 of the silicide-blocked sensitivity for the silicide-blocked (un-silicided) FG-MOSFET higher sensitivity sensor 540, are illustrated.

From the graphic illustration 800, a significant difference in sensitivity is observed between the silicide-blocked FG-MOSFET higher sensitivity sensor 540 and the silicided FG-MOSFET lower sensitivity sensor 520 of otherwise identical or substantially identical properties. This difference in sensitivity is reflected through the difference in floating gate discharge rates which in turn is reflected by a change in the channel current $I_{DS}$. Both the devices of the silicide-blocked FG-MOSFET higher sensitivity sensor 540 and the silicided FG-MOSFET lower sensitivity sensor 520 were biased at −0.1 V. From FIG. 8, it can be seen that the un-silicided version FG-MOSFET higher sensitivity sensor 540 has a higher sensitivity $S_1$ than the sensitivity $S_2$ of the silicided FG-MOSFET lower sensitivity sensor 520. At the 600th second, the silicide-blocked device, the un-silicided version FG-MOSFET higher sensitivity sensor 540, shows a reduction in channel current $I_{DS}$ compared with that for the silicided device, the silicided FG-MOSFET lower sensitivity sensor 520, for example.

As mentioned, and from FIG. 8, using or measuring a change in the channel current $I_{DS}$ for each of the silicided thin-oxide FG-MOSFET lower sensitivity sensor 520 and the un-silicided thin-oxide FG-MOSFET higher sensitivity sensor 540 at a given time of duration (T) of radiation dose delivery correlates to a measure of the dose delivered to an object or product, as sensed by the matched FG-MOSFET sensor pair 500. It has been found that the sensitivity difference between the un-silicided thin-oxide FG-MOSFET higher sensitivity sensor 540 ($S_1$) from the curve plot 802 and that of the silicided thin-oxide FG-MOSFET lower sensitivity sensor 520 ($S_2$) from the curve plot 804 at the given radiation duration time (T) correlates to a dual measure of the radiation dose delivered (D) in Gray (Gy) to an object or a product, such as a blood bag, at the given radiation duration time T. As noted, the difference of the channel current, $I_{DS}$, between either the thin-oxide FG-MOSFET lower sensitivity sensor 520 or the thin-oxide FG-MOSFET higher sensitivity sensor 540 and a reference FG-MOSFET (not shown), at a radiation duration time T, as indicated on the sensitivity curves of the curve plots 802 and 804, respectively, gives a dual reading of dose applied to a product or object, such as to a blood bag, for example.

As seen in FIG. 8, the curve plot 802 pertaining to the silicide-blocked FG-MOSFET device, the un-silicided thin-oxide FG-MOSFET higher sensitivity sensor 540, has a greater change in channel current $I_{DS}$ from their common initial value indicating a higher corresponding radiation sensitivity S. These results also show that the un-silicided FG-MOSFET devices, the un-silicided thin-oxide FG-MOSFET higher sensitivity sensor 540, have better sensitivity S than the silicided FG-MOSFET devices, the thin-oxide FG-MOSFET lower sensitivity sensor 520, with the un-silicided thin-oxide FG-MOSFET higher sensitivity sensor 540 showing a channel current reduction of 190 µA as compared to 160 µA in the thin-oxide FG-MOSFET lower sensitivity sensor 520. The pair of curves, curve plots 802 and 804, presented in FIG. 8 is one from many results generated with the silicided FG-MOSFET device and the silicide-blocked FG-MOSFET device having 10% and 14% variation in results respectively at 600th second, as illustrated in FIG. 8, for example. The plot curves 802 and 804 of the silicided FG-MOSFET device and the silicide-blocked FG-MOSFET device respectively follow each other which indicate that a 3% variation in one plot curve is followed by a 3% variation in the other plot curve. The sensitivity plot 806 in FIG. 8 shows a different behavior compared to the previous case of the sensitivity plot 706 of FIG. 7 which showed an almost linear decrease in sensitivity S. An 85% decrease in sensitivity S is observed from the sensitivity plot 806 versus 50% for the former case of the sensitivity plot 706 which is expected due to higher photon energy and flux in the Raycell MK2 irradiator device than the Faxitron device.

Also, a MOSFET's sensitivity is highly energy dependent. As the electric field within the field oxide under the floating gate extension depreciates, charge separation efficiency decreases to a point where the MOSFET becomes insensitive to ionizing radiation. Any further electron-hole pairs generated will then be recombined due to the lack of a strong electric field. The silicided FG-MOSFET sensors, such as the thin-oxide FG-MOSFET lower sensitivity sensor 520, present a higher energy barrier for the secondary charged particles (electrons and holes resulting from incident X-ray photons) at the interface of $CoSi_2$ and poly-Si which stops some of them crossing this interface and recombining with the excess electrons injected to the poly-Si floating gate. The silicide-blocked FG-MOSFET sensors, such as the thin-oxide FG-MOSFET higher sensitivity sensor 540, facilitate enhanced sensitivity for the silicide-blocked sensor since more holes can reach the floating gate and recombine with the excess charge from the top. The energy barrier can be calculated to be 0.47 eV higher for silicided FG-MOSFETS than FG-MOSFETS without silicide, for example.

As can be seen from FIG. 8, from the plot 806, the sensitivity S of the silicide-blocked FG-MOSFET sensor decreases almost linearly within the first 300 seconds of the radiation session, which is a desirable factor since this change in channel current $I_{DS}$ can be converted to a linear voltage signal, particularly since, typically, 300 seconds is the radiation duration time T required to reliably irradiate a blood bag. Therefore, a linear sensitivity response of the silicide-blocked FG-MOSFET sensor is achieved for the useful period of the exposure, such as for blood irradiation applications, for example. From 300 seconds to 600 seconds, as seen from the plot 806, the sensitivity decreases sub-linearly which typically indicates diminished response, and a lower FG-MOSFET radiation sensitivity can leave the FG-MOSFET more prone to noise-related implications when converted to voltage. However, the minimum resolvable dose detected depends on the noise within the MOS dosimeter and noise considerations and minimum detectable dose can become factors in readout circuit construction to convert the current to a voltage signal, for example.

With regards to pre-irradiation and post-irradiation stability of the FG-MOSFET sensor devices, the same FG-MOSFET sensor device, the FG-MOSFET sensor pair 500, was pre-charged and irradiated repeatedly. Before each irradiation session, the pre-charged FG-MOSFET device was monitored for five minutes in order to ensure charge retention. Also, after each irradiation session, the FG-MOSFET sensor device was monitored for five minutes in order to observe any possible current change such as a decrease, an increase, or fluctuations. At the end of the last irradiation session, the FG-MOSFET sensor device was left connected for approximately fifteen hours to ensure charge stability. As a result, no charge retention issues in pre-irradiation or post-irradiation were observed in the FG-MOSFET device, indicating its suitable for a wireless dosimeter for accurate radiation dose measurements, for example.

A parametric study was carried out on PMOS FG devices in the presence and the absence of a passivation layer, such as in the FG-MOSFET sensor pair 500, as described. Cobalt Silicide (CoSi2) was used as the passivation layer on top of the FG extension. It was observed that the presence of silicide reduces the sensitivity of the FG MOSFET device as compared to the FG-MOSFET devices which do not have these passivation layers. As described, in the FG-MOSFET sensor pair 500, no passivation or silicided layer is desirably used in the thin-oxide FG-MOSFET higher sensitivity sensor 540, since the presence of a passivation layer typically does reduce the sensitivity of the sensor. While it would appear that such results indicate the use of silicide as a downside, as mentioned, the difference of the channel current, $I_{DS}$, between that for the silicided thin-oxide FG-MOSFET lower sensitivity sensor 520 and that for the silicide-blocked thin-oxide FG-MOSFET higher sensitivity sensor 540, at a radiation duration time T, as indicated on the sensitivity curves of the curve plots 802 and 804, respectively, gives or correlates to a dual reading of radiation dose applied to a product or object, such as to a blood bag, for example.

Figure 9:
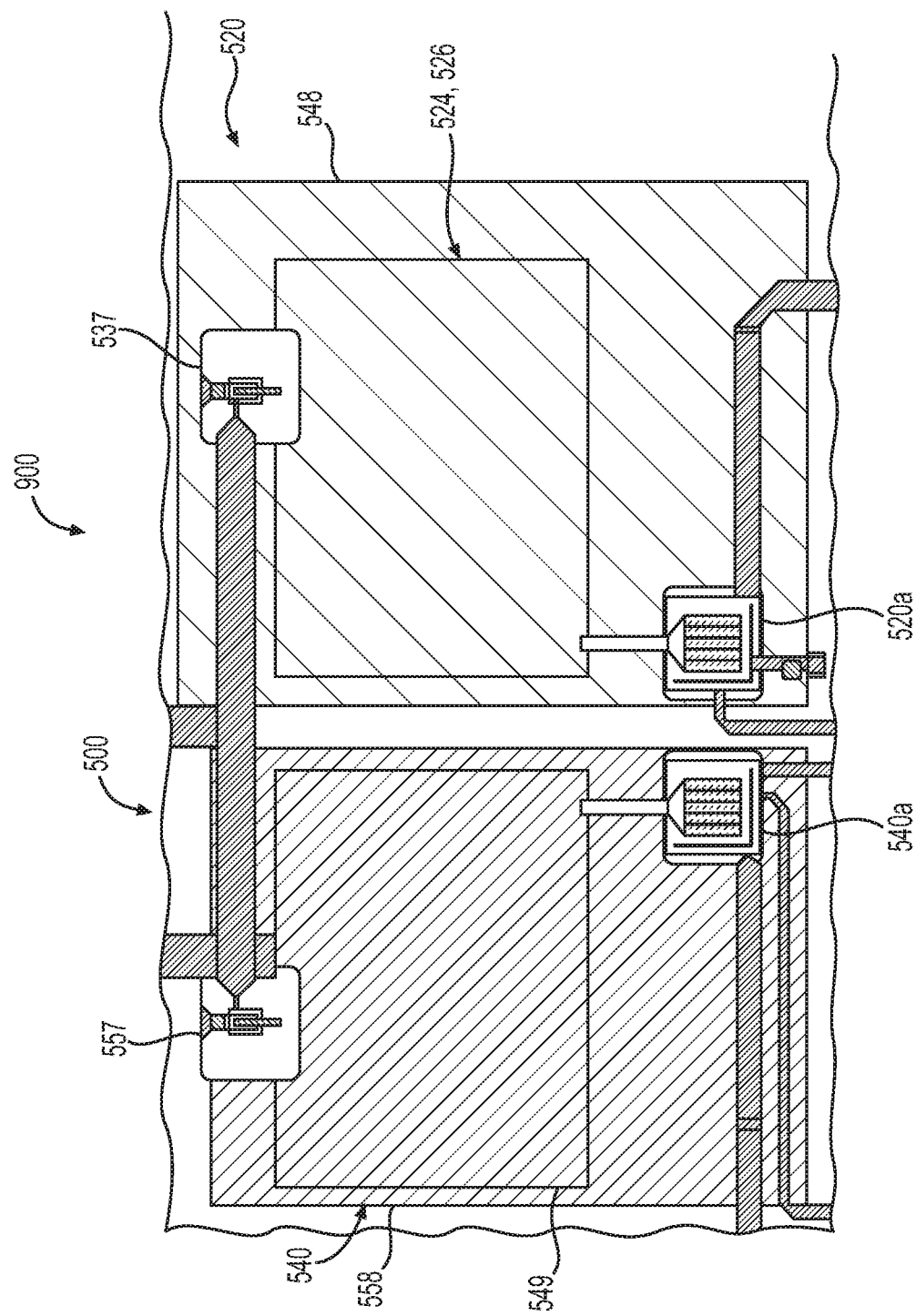
FIG. 9 shows a schematic of an integrated circuit chip layout illustrating embodiments of FG-MOSFET sensors with and without a grounded top metal layer covering the FG-extension, according to the present invention.

FIG. 9 shows a schematic diagram 900 of an integrated circuit chip layout illustrating embodiments of FG-MOSFET sensors of the matched FG-MOSFET sensor pair 500 but with a grounded top metal layer covering the FG-extension, according to the present invention. The FG-MOSFET sensors 520 and 540 illustrated in FIG. 9 are similar to and have the same or similar components as those of described in the matched FG-MOSFET sensor pair 500 of FIG. 5, some of the components described with respect to FIG. 5 being indicated in FIG. 9, including the FG-MOSFET lower sensitivity sensor 520, manufactured by a 0.13 μm RF-CMOS process, the FG-MOSFET higher sensitivity 540, manufactured by a 0.13 μm RF-CMOS process, the FG-MOSFET sensor pair 500 being desirably PMOS FG devices, for example. Additionally, as illustrated in FIG. 9, the FG-MOSFET higher sensitivity sensor 540 desirably includes a shielding metal layer 558 that overlies the floating gate 544a and the floating gate extension 544, and the FG-MOSFET lower sensitivity sensor 520 includes a shielding metal layer 548 overlies the floating gate 524a and the floating gate extension 524.

Figure 10:
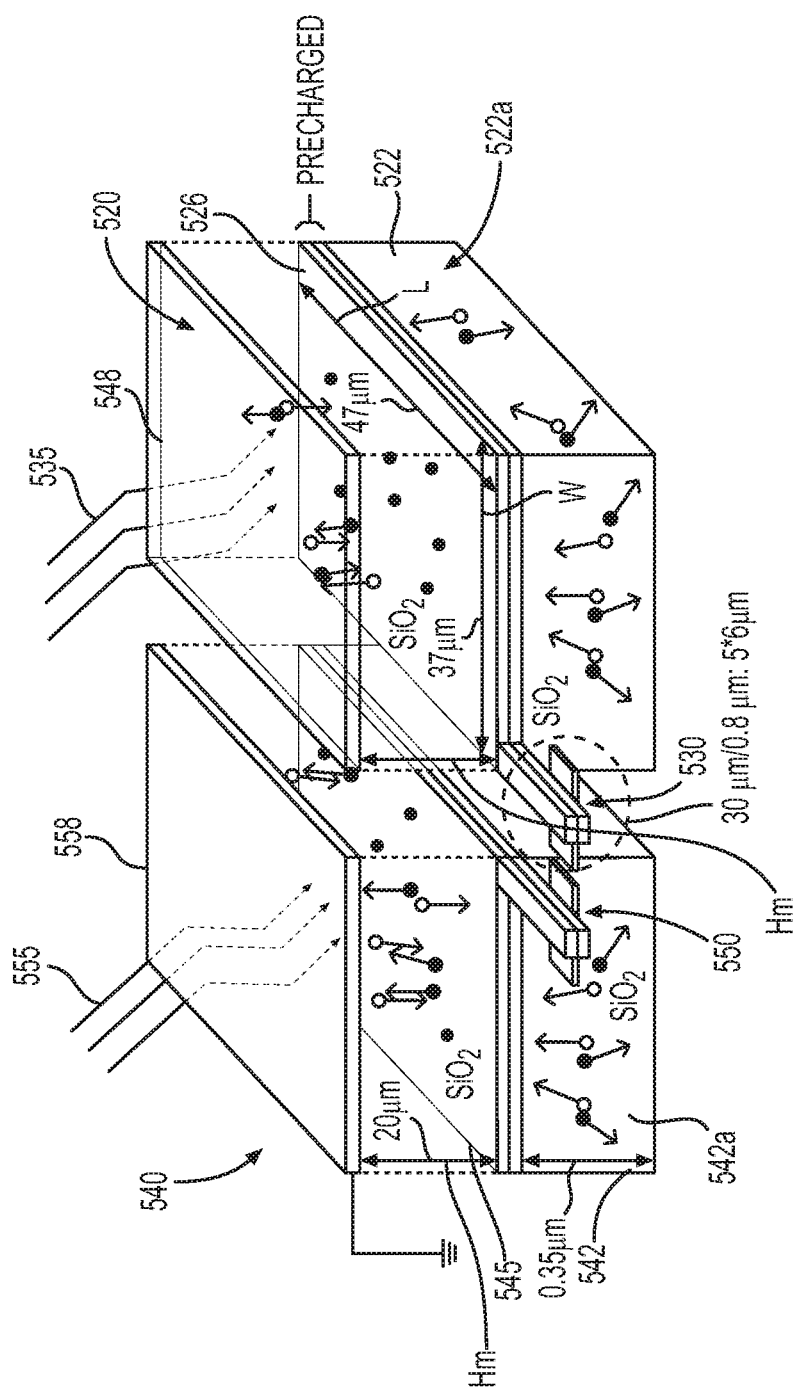
FIG. 10 shows a schematic illustration of embodiments of FG-MOSFET sensors with a grounded top metal layer covering the FG-extension, according to the present invention.

Referring now to FIG. 10, a schematic illustration of embodiments of FG-MOSFET sensors of the matched FG-MOSFET sensor pair 500 of FIG. 5 with a grounded top metal layer covering the FG-extension as in FIG. 9 is shown, according to the present invention. The FG-MOSFET sensors 520 and 540 illustrated in FIG. 10 are similar to and have the same or similar components as those of described in the matched FG-MOSFET sensor pair 500 of FIGS. 5 and 9, with components described with respect to FIGS. 5 and 9 being indicated in FIG. 10, including the FG-MOSFET lower sensitivity sensor 520, manufactured by a 0.13 μm RF-CMOS process, the FG-MOSFET higher sensitivity sensor 540, manufactured by a 0.13 μm RF-CMOS process, the matched FG-MOSFET sensor pair 500 being desirably PMOS FG devices, for example. FIG. 10 schematically illustrates for the FG-MOSFET higher sensitivity sensor 540 the shielding metal layer 558 that overlies the floating gate 544a and the floating gate extension 544, and schematically illustrates for the FG-MOSFET lower sensitivity sensor 520 the shielding metal layer 548 that overlies the floating gate 524a and the floating gate extension 524.

Also, as illustrated in FIG. 10, the respective widths W of the shielding metal layer 548 of the FG-MOSFET lower sensitivity sensor 520 and of the shielding metal layer 558 of the FG-MOSFET higher sensitivity sensor 540 are each of or approximately 37 μm, for example.

The respective lengths L of the shielding metal layer 548 of the FG-MOSFET lower sensitivity sensor 520 and of the shielding metal layer 558 of the FG-MOSFET higher sensitivity sensor 540 are each of or approximately 47 μm, for example. Additionally, the height Hm between the shielding metal layer 548 and the self-aligned silicide layer 526 of the FG-MOSFET lower sensitivity sensor 520 is or approximately 20 μm, and the height Hm between the shielding metal layer 558 and an optional self-aligned silicide layer 545, or between the shielding metal layer 558 and the floating gate extension 544, when the optional self-aligned silicide layer 545 is not present, of the FG-MOSFET higher sensitivity sensor 540 is or approximately 20 μm, of a suitable thickness. The various configurations, thicknesses and dimensions of the shielding metal layers 548 and 558 can be of any of various suitable dimensions, thicknesses and configurations, as can depend on the use or application, and should not be construed in a limiting sense.

Figure 11:
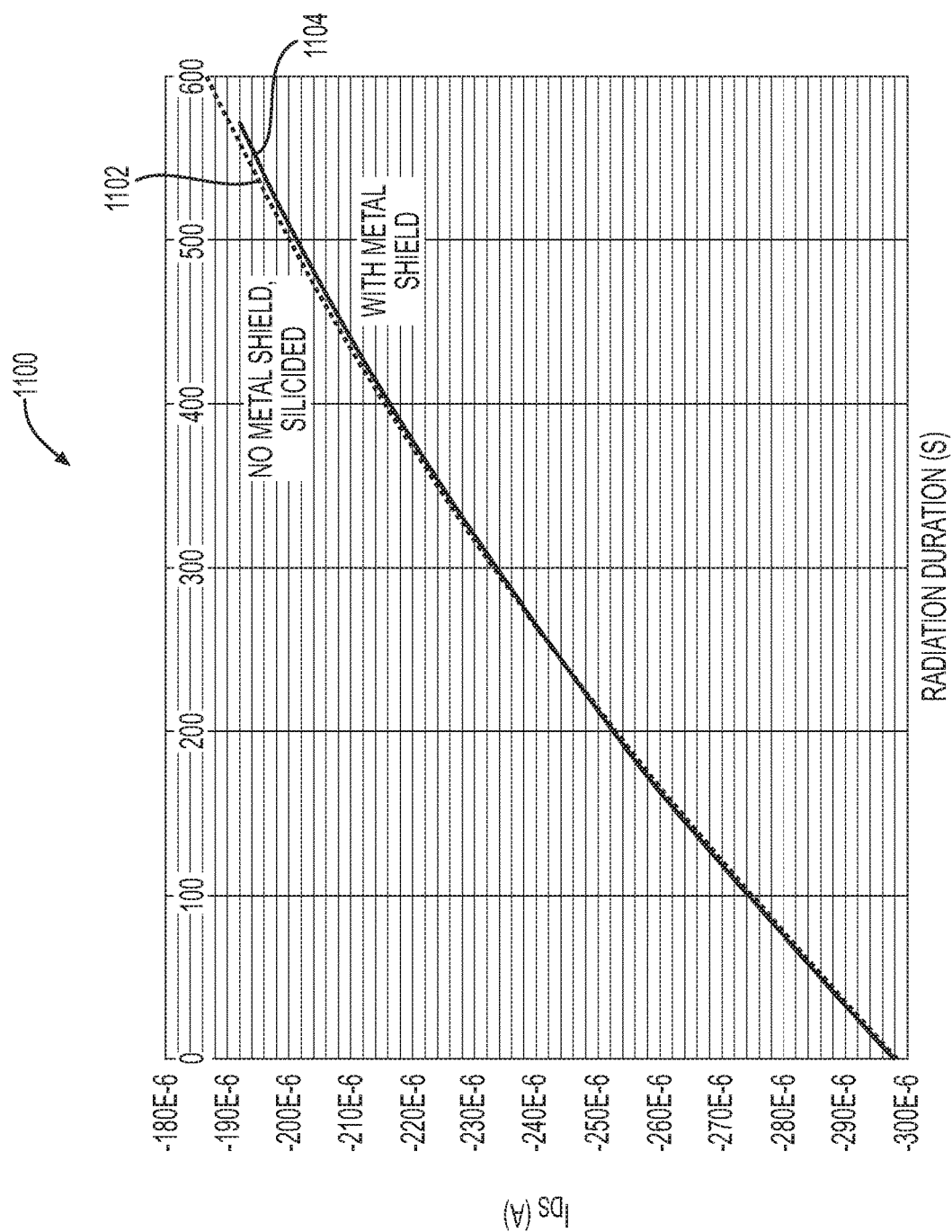
FIG. 11 is a graphic illustration of radiation exposure of embodiments of FG-MOSFET sensors with and without a grounded top metal layer or metal shield covering the FG-extension under radiation of 110 kVp, according to the present invention.

FIG. 11 is a graphic illustration 1100 of radiation exposure of embodiments of the FG-MOSFET sensors, similar to the FG-MOSFET 520 of FIGS. 9 and 10, but one of the FG-MOSFET 520 having the grounded top metal layer or metal shield 548 covering the FG-extension 524 and the silicide layer 526 and the other of the FG-MOSFET 520 not having the grounded top metal layer or metal shield 548 covering the FG-extension 524 and the silicide layer 526 under radiation of 110 kVp X-ray from the Faxitron irradiator device, according to the present invention. In FIG. 11, the channel current $I_{DS}$ in amperes A for the two FG-MOSFET sensors 520 is plotted against radiation duration time in seconds (s). A curve plot 1102 illustrates the channel current $I_{DS}$ at various radiation duration times of the silicided FG-MOSFET 520 not having the grounded top metal layer or metal shield 548. A curve plot 1104 illustrates the channel current $I_{DS}$ at various radiation duration times of the silicided FG-MOSFET 520 having the grounded top metal layer or metal shield 548.

A grounded metal layer covering the floating gate area typically protects it from nearby electric fields that could disturb the charge and can also increase radiation sensitivity of the FG-MOS structure. Floating gate MOS sensors, such as the FG-MOSFET sensors 520, identical or approximately identical in dimensions and arrangement as described with reference to FIG. 10 were fabricated for the measurements made in FIG. 11. One of the FG-MOSFET sensors 520 was covered with the top metal layer (8th metal layer) 548 available in the 0.13 μm RF-CMOS technology and the other FG-MOSFET sensor 520 was fabricated without the metal layer 548 in the 0.13 μm RF-CMOS technology.

Radiation testing of two identical FG-MOS devices, one with grounded metal protection, and one without a grounded metal protection using the 110 kVp X-Ray source from the Faxitron are presented in FIG. 11. As can be seen from FIG. 11 and the curve plots 1102 and 1104, the metal shielded and no metal shield covered FG-MOSFET sensors 520 exposed to the 110 kVp X-ray from the Faxitron radiation source follow the same pattern with a 4% variation around the midpoint of 188.5 μA at 600th second for both variants of the FG-MOSFET sensors 520. From the results shown in FIG. 11, the sensitivity variations cause the irradiation results to be indistinguishable between the variants of the FG-MOSFET sensors 520 with and without the metal coverage or metal protection layer.

Thus, in embodiments of the FG-MOSFET sensors 520 the results from FIG. 11 tend to indicate that the presence of metal surfaces on top of the floating gate structure does not have any significant effect on the device performance which is contrary to the conventional idea for use of the metal shielding layer in thick oxide FG-MOSFET devices. Generally, having a metal shield would tend to increase absorbed dose due to increased coupling between the floating gate and the ground. However, in the FG-MOSFET sensors 520 the same might not be the case since such increased coupling might be offset by the fact that there is a dielectric layer, such as associated with the metal layer 548 in the highest metal layer, almost 20 μm thick, between the metal shield 548 and the floating gate salicided surface 526, such that any electron-hole pair generated within the dielectric region on top of the floating gate 524a and the floating gate extension 524 gets recombined before reaching the floating gate 524a and the floating gate extension 524, as well as the difference in the thick oxide technology from the thin oxide 0.13 μm RF-CMOS technology. However, from FIG. 11, while the presence and absence of the metal protection layer on the FG-MOSFET lower sensitivity sensors 520 does indicate no substantial change in the device efficiency, when the FG-MOSFET lower sensitivity sensors 520 and the FG-MOSFET higher sensitivity sensors 540 are used in wireless dosimeter applications, use of a metal protection layer is desirable in order to isolate the FG-MOSFET sensor from external RF interferences.

Figure 12:
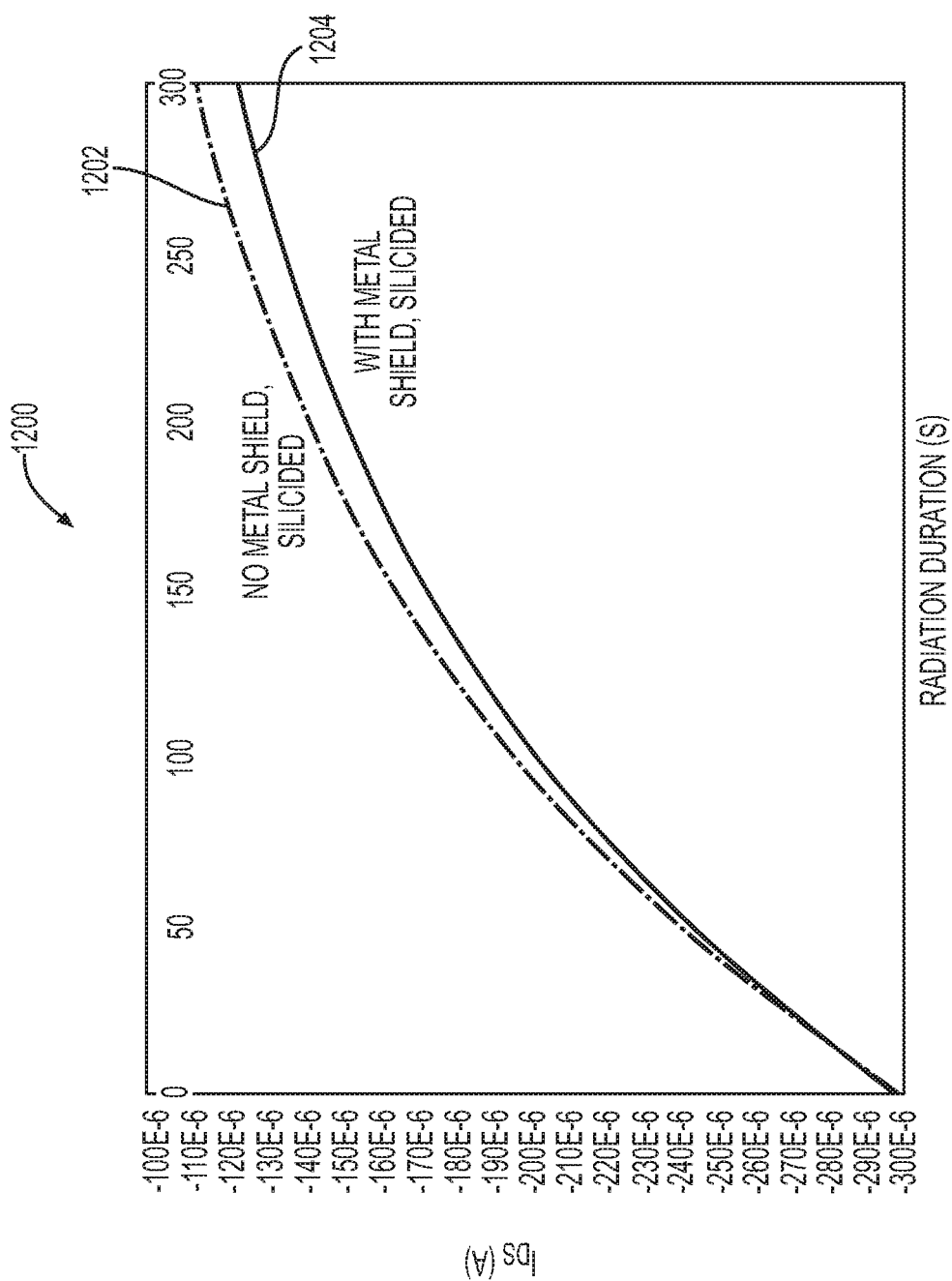
FIG. 12 is a further graphic illustration of radiation exposure of embodiments of FG-MOSFET sensors with and without a grounded top metal layer or metal shield covering the FG-extension under radiation of 110 kVp using a blood irradiator apparatus, according to the present invention.

FIG. 12 is a further graphic illustration 1200 of radiation exposure of embodiments of FG-MOSFET sensors, similar to the FG-MOSFET 520 of FIGS. 9 and 10, but one of the FG-MOSFET 520 having the grounded top metal layer or metal shield 548 covering the FG-extension 524 and the silicide layer 526 and the other of the FG-MOSFET 520 not having the grounded top metal layer or metal shield 548 covering the FG-extension 524 and the silicide layer 526 under radiation of 110 kVp from the Raycell MK2 Blood Irradiator, according to the present invention. In FIG. 12, the channel current $I_{DS}$ in amperes A for the two FG-MOSFET sensors 520 is plotted against radiation duration time in seconds (s). A curve plot 1202 illustrates the channel current $I_{DS}$ at various radiation duration times of the silicided FG-MOSFET 520 not having the grounded top metal layer or metal shield 548. A curve plot 1204 illustrates the channel current $I_{DS}$ at various radiation duration times of the silicided FG-MOSFET 520 having the grounded top metal layer or metal shield 548.

The floating gate MOS sensors, such as the FG-MOSFET sensors 520, having identical or approximately identical dimensions and arrangement as described with reference to FIG. 10, were fabricated for the measurements made in FIG. 12. One of the FG-MOSFET sensors 520 was covered with the top metal layer (8th metal layer) 548 available in the 0.13 μm RF-CMOS technology and the other FG-MOSFET sensor 520 was fabricated without the metal layer 548 in the 0.13 μm RF-CMOS technology.

The metal shielded FG-MOSFET sensor 520 and the no metal shield covered FG-MOSFET sensor 520 were exposed to X-ray from Raycell MK2 blood irradiator machine under radiation of 110 kVp. The results of the irradiation of the FG-MOSFET sensors 520 are shown in FIG. 12. Despite the fact that the two curve plots 1202 and 1204 show a difference in behavior, further irradiations of multiple FG-MOSFET sensors 520 with radiation generated by the Raycell MK2 blood irradiator machine have shown a variation in results of approximately ≈14.5% at the 300th second of radiation duration time T without a correlation. Thus, such results indicate that there is no clear distinction between results of metal shielded and not metal shielded FG-MOSFET sensor 520 devices. Such results are therefore in agreement with the results illustrated in FIG. 11 of the irradiation of the metal shielded and not metal shielded FG-MOSFET sensor 520 devices using the Faxitron 110 kVp X-ray source.

Thus, in embodiments of the FG-MOSFET sensors 520 the results from FIGS. 11 and 12 tend to indicate that the presence of metal surfaces on top of the floating gate structure does not have any significant effect on the device performance which, as discussed, is contrary to the conventional idea for use of the metal shielding layer in thick oxide FG-MOSFET devices. However, as discussed, when the FG-MOSFET lower sensitivity sensors 520 and the FG-MOSFET higher sensitivity sensors 540 are used in wireless dosimeter applications, use of a metal protection layer is desirable in order to isolate the FG-MOSFET sensor from external RF interferences. The results thus obtained show that these metal layers do not have any effect on the device performance, but since the metal layer could still shield the sensitive floating gate from electromagnetic interference its use is desirable in wireless dosimeter measurement applications, for example.

Figure 13:
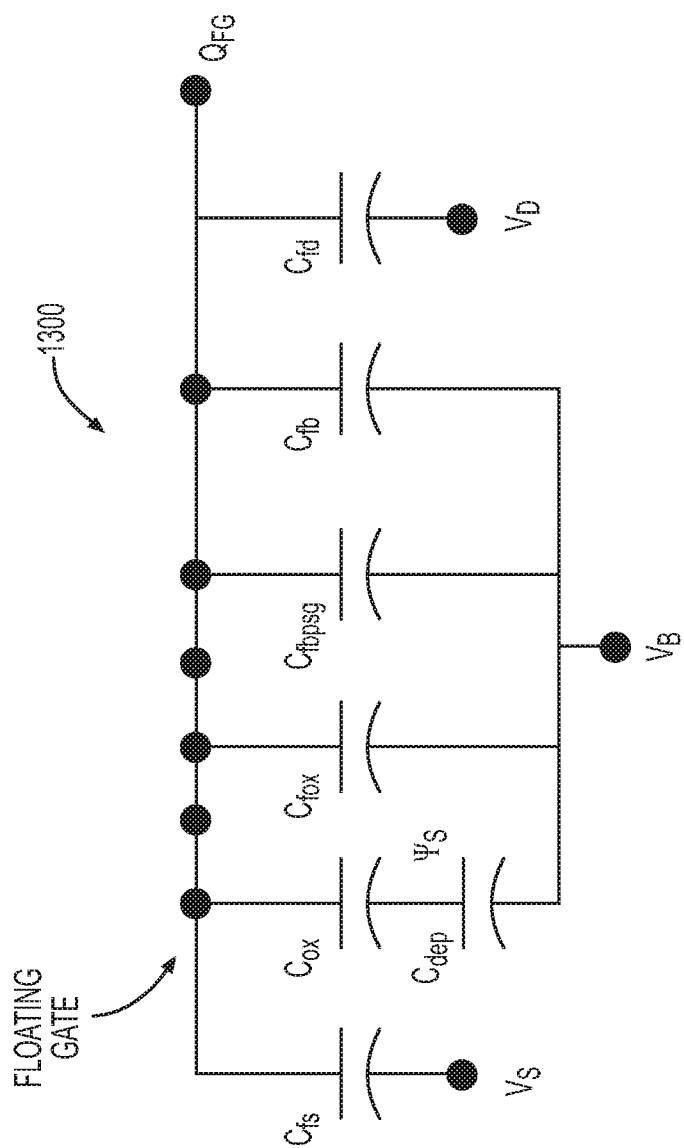
FIG. 13 shows a circuit diagram of a capacitor model for embodiments of a FG-MOSFET sensor, according to the present invention.

FIG. 13 shows a circuit diagram of a capacitor model 1300 for embodiments of the FG-MOSFET sensors 520 and 540 of FIGS. 5, 6, 9 and 10, according to the present invention. As can be seen from FIG. 13, there are a variety of capacitances that eventually constitute the overall effect on the electrical performance of the FG-MOSFET sensors 520 and 540. These include the oxide capacitances $C_{OX}$, $C_{fbpsg}$, and $C_{fOX}$, the depletion capacitance $C_{dep}$, while there are additional capacitances between the floating gate and the device terminals $C_{fs}$, $C_{fb}$, and $C_{fd}$. $Q_{FG}$ is the total charge that is accumulated on the gate terminal of the FG-MOSFET sensors 520 and 540.

Figure 14:
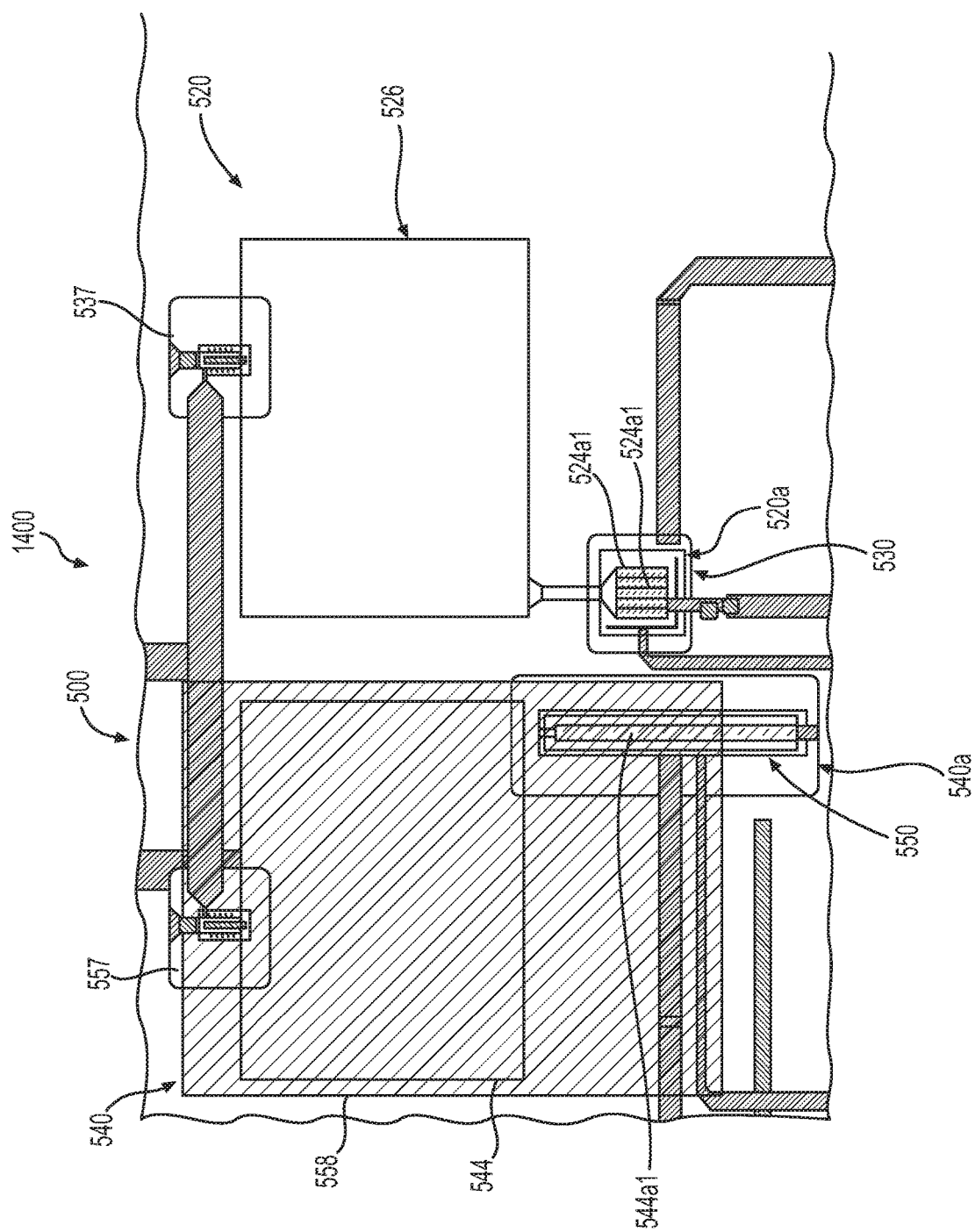
FIG. 14 shows a schematic of an integrated circuit chip layout illustrating embodiments of FG-MOSFET sensors with a single finger FG-sensor and a multi-finger FG sensor, according to the present invention.

FIG. 14 shows a schematic of an integrated circuit chip layout 1400 illustrating embodiments of FG-MOSFET sensors 540 and 520 of FIGS. 4, 5, 9 and 10 with a single finger FG-sensor and a multi-finger FG sensor, according to the present invention. The FG-MOSFET sensors 520 and 540 illustrated in FIG. 14 are similar to and have the same or similar components as those of described in the matched FG-MOSFET sensor pair 500 of FIG. 5, some of the components described with respect to FIG. 5 being indicated in FIG. 14, including the FG-MOSFET lower sensitivity sensor 520, manufactured by a 0.13 μm RF-CMOS process, the FG-MOSFET higher sensitivity sensor 540, manufactured by a 0.13 μm RF-CMOS process, the matched FG-MOSFET sensor pair 500 being desirably PMOS FG devices, for example.

Additionally, as illustrated in FIG. 14, embodiments of the FG-MOSFET sensor structure unlike conventional FG-MOSFET sensors, while they can include a single gate finger 544a1 in a sensor area 540a, desirably include a plurality of gate fingers 524a1 in a sensor area 520a that communicate with a floating gate extension that receives the radiation, the plurality of gate fingers 524a1 providing enhanced efficiency and flexibility and freedom to satisfy optimum device layout requirements for the low-power FG-MOSFET sensor structure. The FG-MOSFET sensors 520 and 540 can each have a single gate finger, such as the single gate finger 544a1, or can have a plurality of gate fingers, such as the plurality of gate fingers 524a1, as can depend on the use, application or configuration, and should not be construed in a limiting sense.

Referring to FIG. 14 and FIG. 9, as discussed, the channel regions 530 and 550 are desirably each formed of a plurality of gate fingers 524a1, such as five fingers of approximately 6 μm each (30 μm/0.8 μm=5*6 μm fingers), for example, although a single gate finger 544a1 or other suitable number of gate fingers can be used, as can depend on the use or configuration, for example.

MOS transistors, such as the FG-MOSFET sensors 520 and 540 can be laid out on the integrated circuit chip having only one finger, such as the single finger 544a1, or multiple fingers, such as the plurality of fingers 524a1. Some of the benefits of having multi-fingers 524a1, such as five fingers, is that a reduction in chip space occupied by the transistor and more immunity against fabrication process variations are facilitated which can lead to characteristic ($V_{th}$, $L_{eff}$ dimension) variations, for example, although multi-finger transistors can have additional parasitic capacitance which can affect the sensitivity. Use of a single gate finger 544a1 or multiple gate fingers 524a1, or combinations thereof, can depend on a combination of MOS capacitances, such as illustrated in FIG. 13, and the use or application, for example. Also, various configurations and dimensions of the single finger 544a1 and the plurality of gate fingers 524a1 as can be used with the FG-MOSFET lower sensitivity sensor 520 and the FG-MOSFET higher sensitivity sensor 540 can be of any of various suitable dimensions and configurations, as can depend on the use or application, and should not be construed in a limiting sense.

As illustrated in FIG. 14, the single finger FG-MOSFET sensor transistor 540 (left in FIG. 14) versus the multi-finger FG-MOSFET sensor transistor 520 (right in FIG. 14) are illustrated in a layout view of the multi-gate finger against a single gate finger FG-MOS device, such as in the matched FG-MOSFET sensor pair 500. In FIG. 14, the single finger FG-MOSFET sensor transistor 540 and the multi-finger FG-MOSFET sensor transistor 520 have identical or approximately identical width length WL values. The layout of the matched FG-MOSFET sensor pair 500 in FIG. 14 was done by fabricating a separate FG-MOSFET sensor pair 500 using the same 0.13 μm RF-CMOS process to consider radiation sensitivity variations across different chips and runs, even though it is nominally assumed to be the same. The FG-MOS sensors of the FG-MOSFET sensor pair 500 were fabricated to desirably have a WL=30 μm 0.8 μm and a gate extension of 47 μm×37 μm which sets the ratio of gate extension to active region to approximately ≈75%, for example. In wireless dosimeter applications, antenna rules typically indicate a maximum ratio of 100% of the gate extension to the active region in order to reduce the chance of gate oxide damage during the fabrication of the FG-MOSFET sensors. However, a 75% ratio of the gate extension to the active region is indicated as being an acceptable ratio in the design of the FG-MOSFET sensors 520 and 540 of the FG-MOSFET sensor pair 500, such as for use in wireless dosimeters, considering the fact that floating gates typically do not have a means to discharge the excess charge accumulated on them during fabrication.

Figure 15:
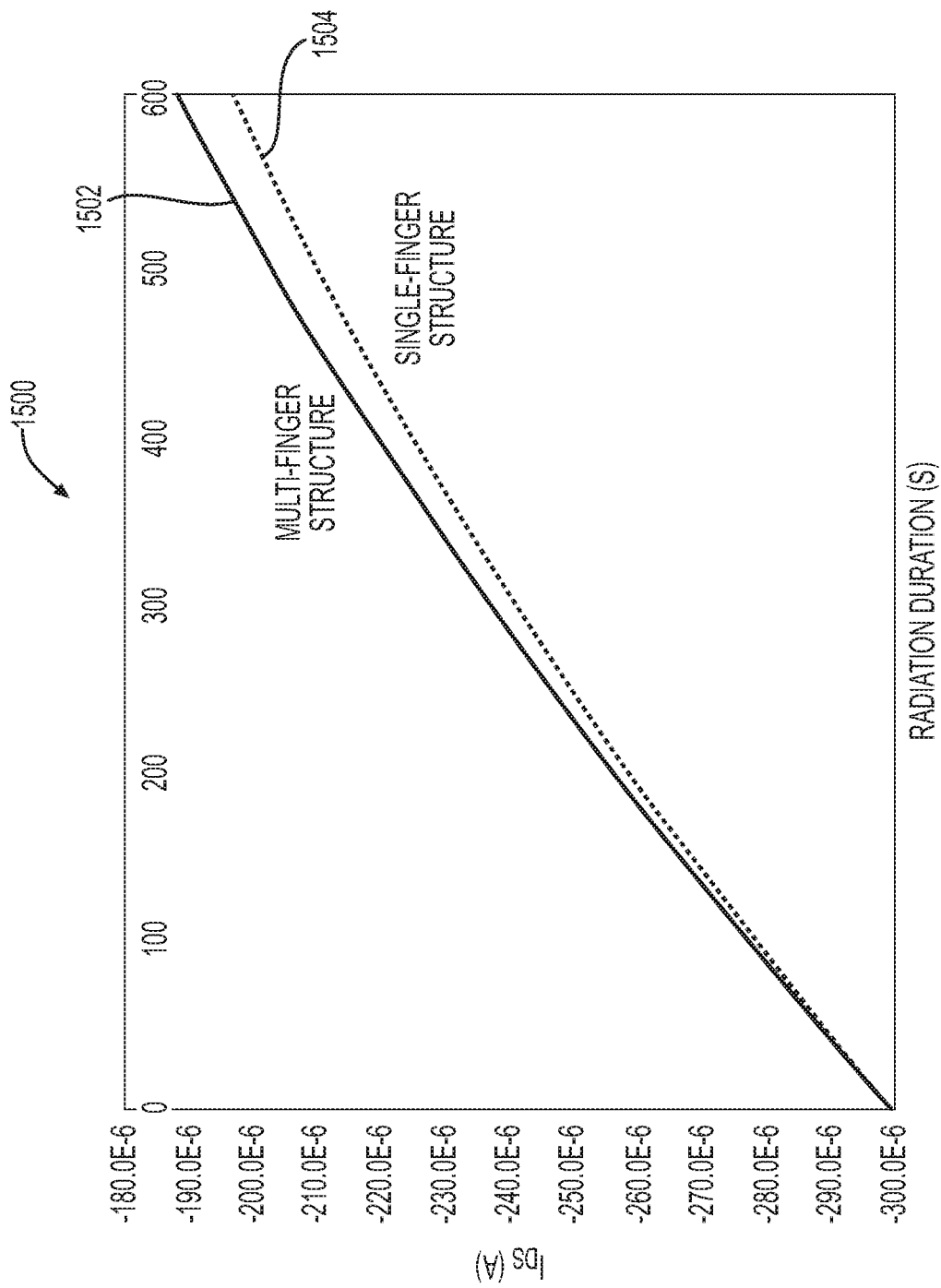
FIG. 15 is a graphic illustration of radiation dose as measured by $I_{DS}$ versus radiation duration for embodiments of FG-MOSFET sensors with a single finger FG-sensor and a multi-finger FG sensor for a 110 kVp radiation source, according to the present invention.

FIG. 15 is a graphic illustration 1500 of radiation dose as measured by $I_{DS}$ versus radiation duration time T for embodiments of FG-MOSFET sensors with a single finger FG-MOSFET sensor and a multi-finger FG-MOSFET sensor for the Faxitron 110 kVp radiation source, according to the present invention. In the irradiation illustration of FIG. 15, the FG-MOSFET sensors of the matched FG-MOSFET sensor pair 500 of FIG. 14 were similar to embodiments of the FG-MOSFET sensors 520 and 540 of FIGS. 4, 5, 9 and 10, but one of the FG-MOSFET sensors had a plurality of gate fingers and the other FG-MOSFET sensor had a single gate finger floating gate FG-MOSFET-sensor. In FIG. 15, the channel current $I_{DS}$ in amperes A for the two FG-MOSFET sensors is plotted against radiation duration time T in seconds (s). A curve plot 1502 illustrates the channel current $I_{DS}$ at various radiation duration times T for the multi-finger gate FG-MOSFET sensor. A curve plot 1504 illustrates the channel current $I_{DS}$ at various radiation duration times T for the single finger gate FG-MOSFET sensor.

The single-finger gate structure and the multiple-finger gate structure were exposed to the 110 kVp X-ray irradiation generated by the Faxitron, with the analysis provided in FIG. 15 illustrating the effect on $I_{DS}$ of using the multi-finger gate structure as opposed to the single finger gate structure. As can be seen from the curve plots 1502 and 1504, the variation in the channel current $I_{DS}$ for the two configurations is relatively small for the same intensity of radiation. This slight difference is due to the additional gate capacitance of the multi-finger devices. This capacitance comes due to the presence of multiple fingers in the gate implementation which introduces mutual capacitance among the multiple gate fingers. Due to this change in the gate capacitance, the sensitivity S of the multi-finger FG-MOSFET sensors is typically better than that for the single finger FG-MOSFET sensors. Such difference in sensitivity can be advantageous, especially at higher dose levels, and can desirably be utilized in the FG-MOSFET sensor design, such as for use of FG-MOSFET sensors in wireless dosimeters, for example. From the graphic illustration 1500, the radiation results' variation is approximately ≈2% and a distinguishable difference in results in the devices tested was indicated.

Figure 16:
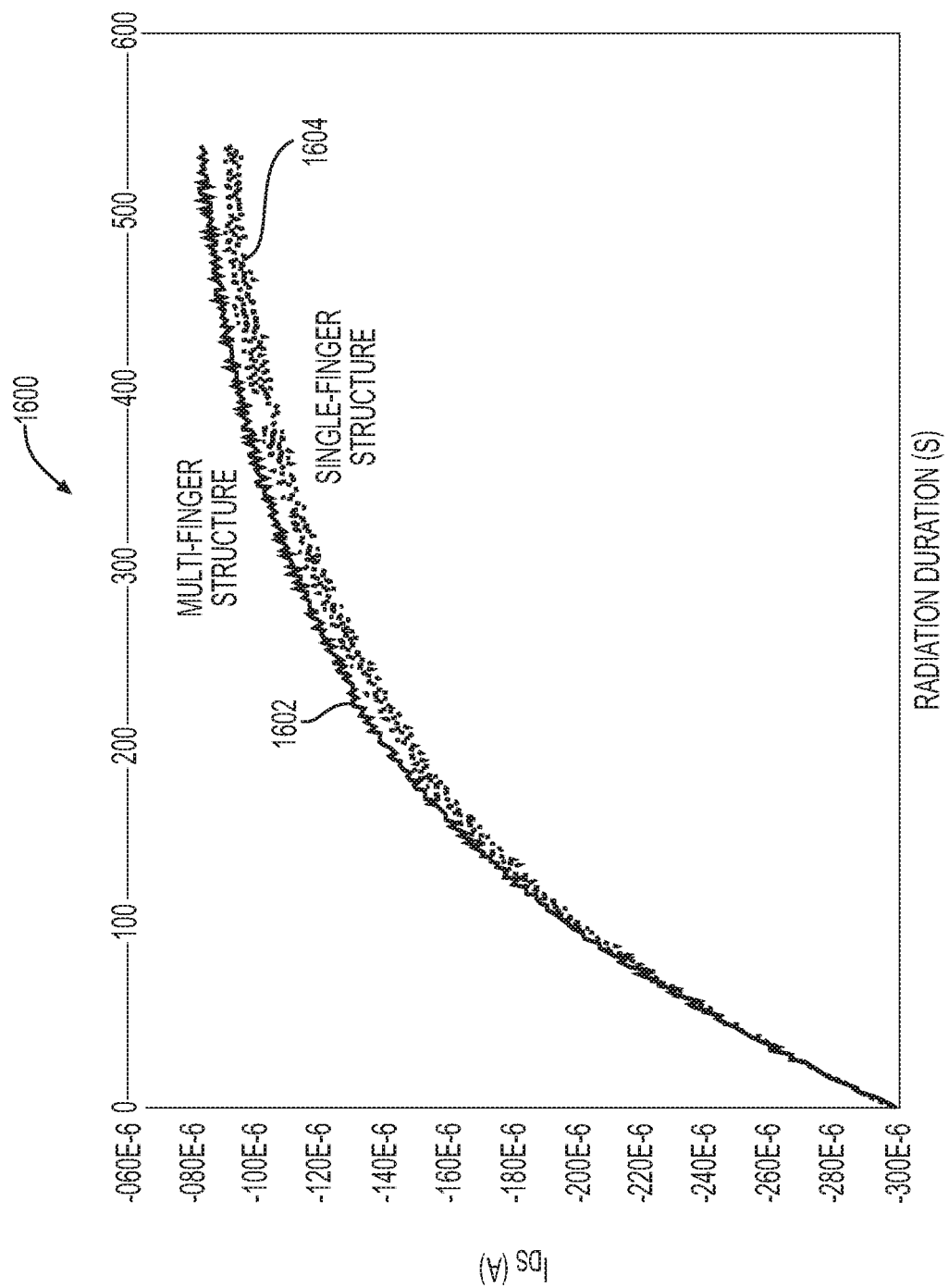
FIG. 16 is a graphic illustration of radiation dose as measured by $I_{DS}$ versus radiation duration for embodiments of FG-MOSFET sensors with a single finger FG-sensor and a multi-finger FG sensor for a 110 kVp radiation source using a blood irradiation apparatus, according to the present invention.

FIG. 16 is a graphic illustration 1600 of radiation dose as measured by $I_{DS}$ versus radiation duration time T for embodiments of FG-MOSFET sensors with a single finger FG-sensor and a multi-finger FG sensor for radiation delivery by the Raycell MK2 110 kVp radiation source, according to the present invention. In the irradiation illustration of FIG. 16, the FG-MOSFET sensors of the matched FG-MOSFET sensor pair 500 of FIG. 14 were similar to embodiments of the FG-MOSFET sensors 520 and 540 of FIGS. 4, 5, 9 and 10, but one of the FG-MOSFET sensors had a plurality of gate fingers and the other FG-MOSFET sensor had a single gate finger. In FIG. 16, the channel current $I_{DS}$ in amperes A for the two FG-MOSFET sensors is plotted against radiation duration T time in seconds (s). A curve plot 1602 illustrates the channel current $I_{DS}$ at various radiation duration times T for the multi-finger gate FG-MOSFET sensor. A curve plot 1604 illustrates the channel current $I_{DS}$ at various radiation duration times T for the single finger gate FG-MOSFET sensor.

From FIG. 16, the single finger gate and the multiple finger gate FG-MOSFET sensor structures were exposed to X-rays from the Raycell MK2 blood irradiator machine. The curve plots 1602 and 1604 illustrate a sample radiation exposure measurement of the multi-finger and single finger FG-MOSFET sensor devices to the X-rays from the Raycell MK2 blood irradiator machine, measured as $I_{DS}$ at various radiation duration times T. As can be seen from the curve plots 1602 and 1604, the multi-finger FG-MOSFET sensor device shows a higher sensitivity S compared to that of the single finger FG-MOSFET sensor, which is in substantial agreement with sensitivity results from the curve plots 1502 and 1504 for the Faxitron 110 kVp X-ray source results of FIG. 15. The results variation from the curve plots 1602 and 1604 is indicated as approximately ≈5%, for example.

Employing multiple gate fingers for the FG-MOSFET sensor instead of using a single gate finger for the FG-MOSFET sensor while maintaining the same channel dimensions of the MOS transistor generally will not result in a significant change in the power consumption, sensitivity or linearity of the sensor. However, as discussed, due to a change in the gate capacitance, the sensitivity S of the multi-finger FG-MOSFET sensors is typically better than that for the single finger FG-MOSFET sensors. Such difference in sensitivity can be advantageous, especially at higher dose levels, and can desirably be utilized in the FG-MOSFET sensor design, such as for use of FG-MOSFET sensors in wireless dosimeters, for example.

Also, having multiple gate fingers for the FG-MOSFET sensor can allow for added flexibility and increased suitability for various designs, configurations and applications, for example. However, as evident from the graphic illustrations 1500 of FIG. 15 and 1600 of FIG. 16, varying the number of gate fingers as to the effects on the channel current $I_{DS}$ of the FG-MOSFET sensor devices when exposed to the radiation, generally indicated no substantial change in the sensitivity S, but use of a single gate finger or various numbers of multiple gate fingers can facilitate designer freedom to satisfy optimum device layout requirements for the FG-MOSFET sensors for various applications and configurations of wireless dosimeters and other applications, for example.

Charging and discharging methods for embodiments of FG-MOSFET sensors 520 and 540 of the matched FG-MOSFET sensor pair 500, such as those described of FIGS. 4, 5, 9, 10 and 14, have been performed on the FG-MOSFET sensor devices using pulse generators in order to determine the pulse height and widths for radiation dose measurement, such as for use in low power wireless dosimeter applications. In embodiments of charging and discharging methods, it is important to minimize the complexity of the circuitry which will be implemented to carry out the manual or automated charging/discharging of the floating gate FG-MOSFET sensor devices. In wireless dosimeter devices, a potential structure, such as a positive/negative pulse generator, is typically included on the wireless dosimeter chip.

A common practice in charging the floating gate MOSFETs, such as for non-volatile memory devices, is the hot carrier injection (HCI). In HCI, a large bias across the drain/source while applying a large voltage on a control gate above the floating gate is maintained that causes a large current $I_{DS}$ in the device. This relatively large current creates electron-hole pairs in the channel. A percentage of these generated charges are accelerated through the gate oxide and placed onto the floating gate, hence charging the floating gate MOSFET device. However, HCI typically requires a large current through the channel, but in the case of a low power sensor a with limited power budget, it typically is difficult to charge the MOSFET sensor device. However, it was determined that applying pulses to the shorted PMOS pre-charger devices 537 and 557, illustrated in FIGS. 9 and 14, for example, could charge and discharge the floating gate of the MOSFET sensor device without the use of a relatively large current through the channel as typically used in HCI, for example.

In charging the sensors of embodiments of the FG-MOSFET sensor device, such as the FG-MOSFET sensors 520 and 540, the pulses used to charge/discharge the floating gate have certain characteristics namely, polarity, pulse width, pulse height, duty cycle, and the number of pulses applied. Also, the discharge process of embodiments of the FG-MOSFET sensor device, such as the FG-MOSFET sensors 520 and 540, involves applying positive polarity pulses to the shorted PMOS and its nWell body while the substrate is grounded. This causes the nWell body to the p-doped substrate diode to be reverse biased during the positive pulse causing the depletion of excess electrons from the floating gate, hence reducing the FG-MOSFET device's channel current $I_{DS}$. The tunneling effect utilized in the charging/discharging process typically depends on the gate oxide thickness. Voltage pulses lower than a certain value would not cause tunneling. As discussed with reference to FIGS. 17-20, methods for charging and discharging embodiments of FG-MOSFET sensor devices, such as the FG-MOSFET sensors 520 and 540 are discussed, the FG-MOSFET sensor devices being pre-charged to close to the maximum possible charge on the floating gate which corresponds to the maximum amount of $I_{DS}$ at a set drain/source bias of −0.1 V, for example.

Figure 17:
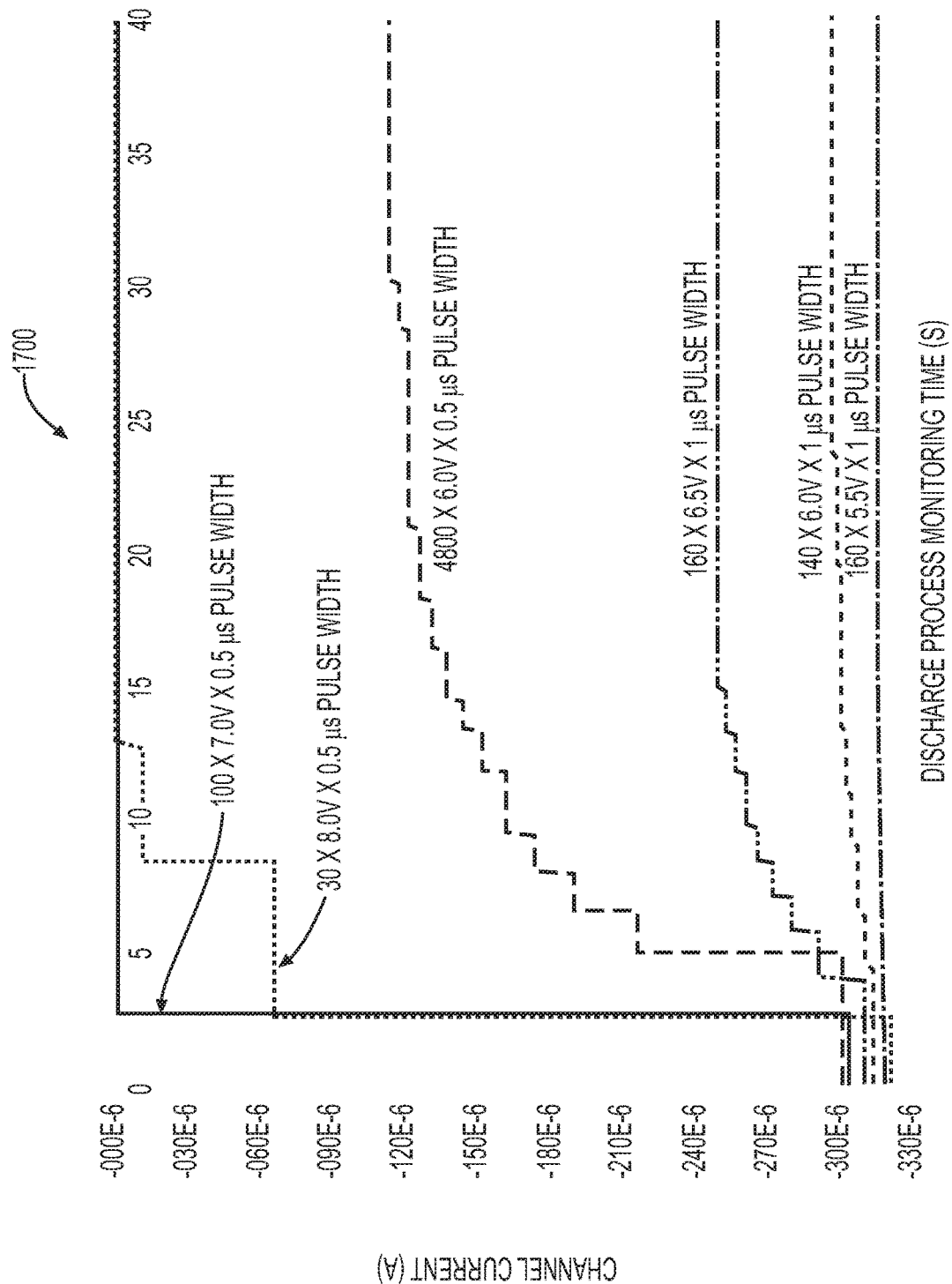
FIG. 17 is a graphic illustration of a discharging process of an embodiment of a FG-MOSFET sensor of channel current versus discharge process monitoring time for embodiments of FG-MOSFET sensors applying different pulse heights and number of pulses for the discharge, according to the present invention.

FIG. 17 is a graphic illustration 1700 of a discharging process of an embodiment of a FG-MOSFET sensor, such as the FG-MOSFET sensors 520 and 540. In the graphic illustration 1700, channel current in amperes (A) is plotted against discharge process monitoring time in seconds (s), different pulse heights and number of pulses for the discharge were applied, as well as different amplitudes of pulses were applied during the discharge process, according to the present invention. Pulse heights below 5.5 V do not discharge the FG-MOSFET sensor device. Hence, in FIG. 17, pulse height values below 5.5 V were omitted. It was further found, as shown from the graphic illustration 1700, that pulse heights of 6.0 V or 6.5 V do discharge the FG MOSFET sensor device, but not completely, even though longer pulse widths were applied meaning that no matter how many pulses of different pulse widths are applied, beyond a certain point, no discharge occurs. As further shown in the graphic illustration 1700, when the pulse height was increased to 7.0 V it was found such value for pulse height, when increased to 7.0 V, discharges the FG MOSFET sensor device effectively and completely, for example.

It was further determined that an optimum pulse train of 100 pulses each of 0.5 µs (50% duty cycle) depletes the floating gate of the FG-MOSFET sensor device, and such pulse is indicated as the minimum requirement to completely discharge the floating gate of the FG-MOSFET sensor device. While voltages higher than 7.0 V could surely discharge the floating gate of the FG-MOSFET sensor device, such higher voltage would also typically require higher pulses generated which in turn typically means more complexity, more stages of voltage multipliers and more power consumption for the discharge process, which can be disadvantageous for low power applications.

Having the optimum pulse height for discharging the floating gate of the FG-MOSFET sensor device, it would be desirable to charge the floating gate of the FG-MOSFET sensor device by the same pulse height value, but in the opposite polarity of −7.0 V. Such value of −7.0 V for charging the floating gate of the FG-MOSFET sensor device is desirable in that a positive pulse generator used for the discharge process could be converted to a negative pulse generator providing the negative voltage value for the charging process relatively easily, such as by adding one extra stage for such conversion.

In determining the optimum pulse width and duty cycle in order to minimize the time to charge the floating gate of the FG MOSFET sensor device, a plurality of pulse trains of −7.0 V with different pulse widths and periods and pulse counts were tested. The negative pulses were applied to the shorted drain/source of the pre-charger PMOS device, such as the pre-charger devices 537 and 557. In this configuration, the body of the PMOS (nWell) could be left floating or tied to the p-substrate (ground (GND) or common). Such configuration would typically stop any junction diode within the structure to forward bias during the pre-charging stage. The pulse width was chosen to stay at 0.5 µs as was in the case of discharge setup and only duty cycle (pulse period) and pulse counts were varied. The various embodiments of the FG-MOSFET sensor devices utilized in the charging/discharging process had the same pre-charger/discharger structure to simplify evaluation of the charge/discharge cycles, as may also provide an indication as to whether or not the oxide breaks down under the pulses applied at the applied voltages.

Manual single pulses were applied to the pre-charger device (shorted PMOS) and then automated pulse generation was applied for the pre-charging process. By single application of each pulse to the floating gate of the FG-MOSFET sensor device, the behavior of the channel current was monitored in order to observe any rebound or fluctuation right after the pulse application.

Figure 18:
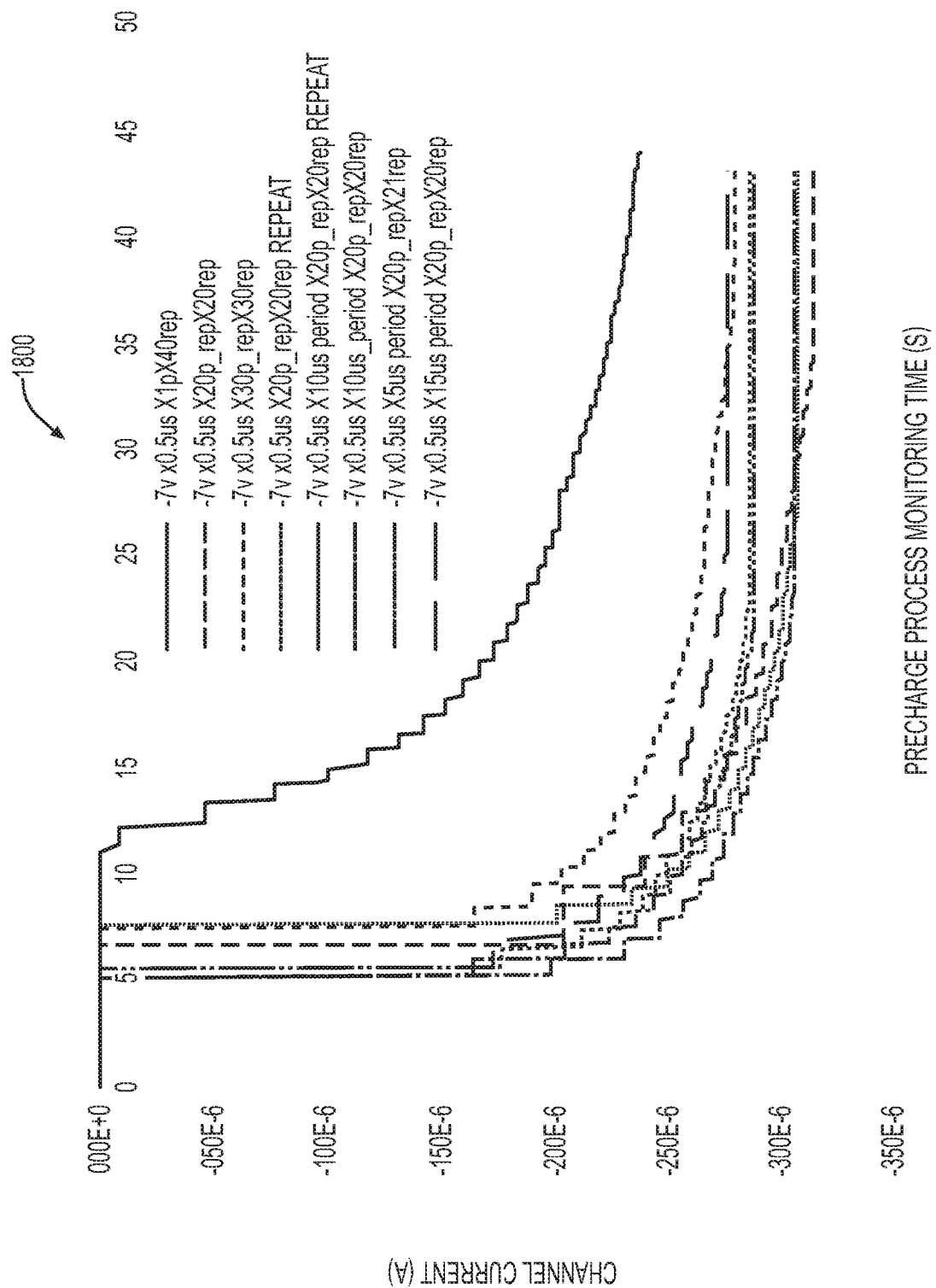
FIG. 18 is a graphic illustration of a manual pre-charging process of an embodiment of a FG-MOSFET sensor of channel current versus pre-charge process monitoring time for embodiments of FG-MOSFET sensors applying pulse widths and periods at various repetitions, according to the present invention.

FIG. 18 is a graphic illustration 1800 of a manual pre-charging process of an embodiment of a FG-MOSFET sensor illustrating channel current in amperes (A) versus pre-charge process monitoring time in seconds (s) for embodiments of FG-MOSFET sensors applying pulse widths and periods at various repetitions, according to the present invention. It can be seen from the graphic illustration 1800 that except for one trace all other traces indicate pre-charging to almost the same value of channel current. The one trace simply shows a lower number of pulses applied to it, which in turn shows a lower current.

Figure 19:
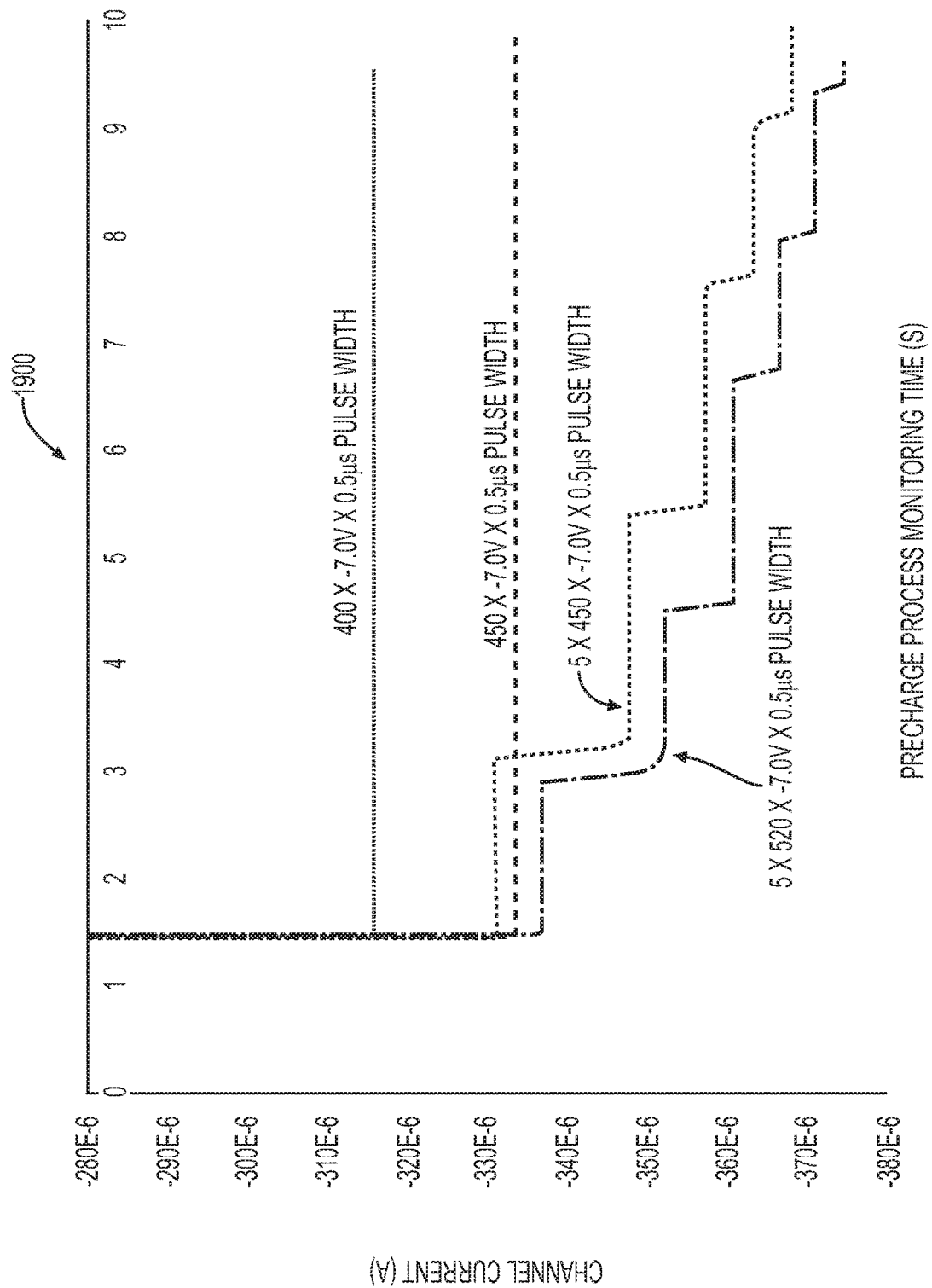
FIG. 19 is a graphic illustration of an automated pre-charging process of an embodiment of a FG-MOSFET sensor of channel current versus pre-charge process monitoring time for embodiments of FG-MOSFET sensors applying different numbers of pulses in a pulse train to a pre-charger device associated with the FG-MOSFET sensor, according to the present invention.

FIG. 19 is a graphic illustration 1900 of an automated pre-charging process of an embodiment of a FG-MOSFET sensor illustrating channel current in amperes (A) versus pre-charge process monitoring time in seconds (s) for embodiments of FG-MOSFET sensors applying different numbers of pulses in a pulse train to a pre-charger device associated with the FG-MOSFET sensor, according to the present invention. In the graphic illustration 1900, automated pulses were applied and the number of pulses in a pulse train applied to the shorted PMOS pre-charger device and pulse information is shown in the legends associated with the various traces in the graphic illustration 1900.

Figure 20:
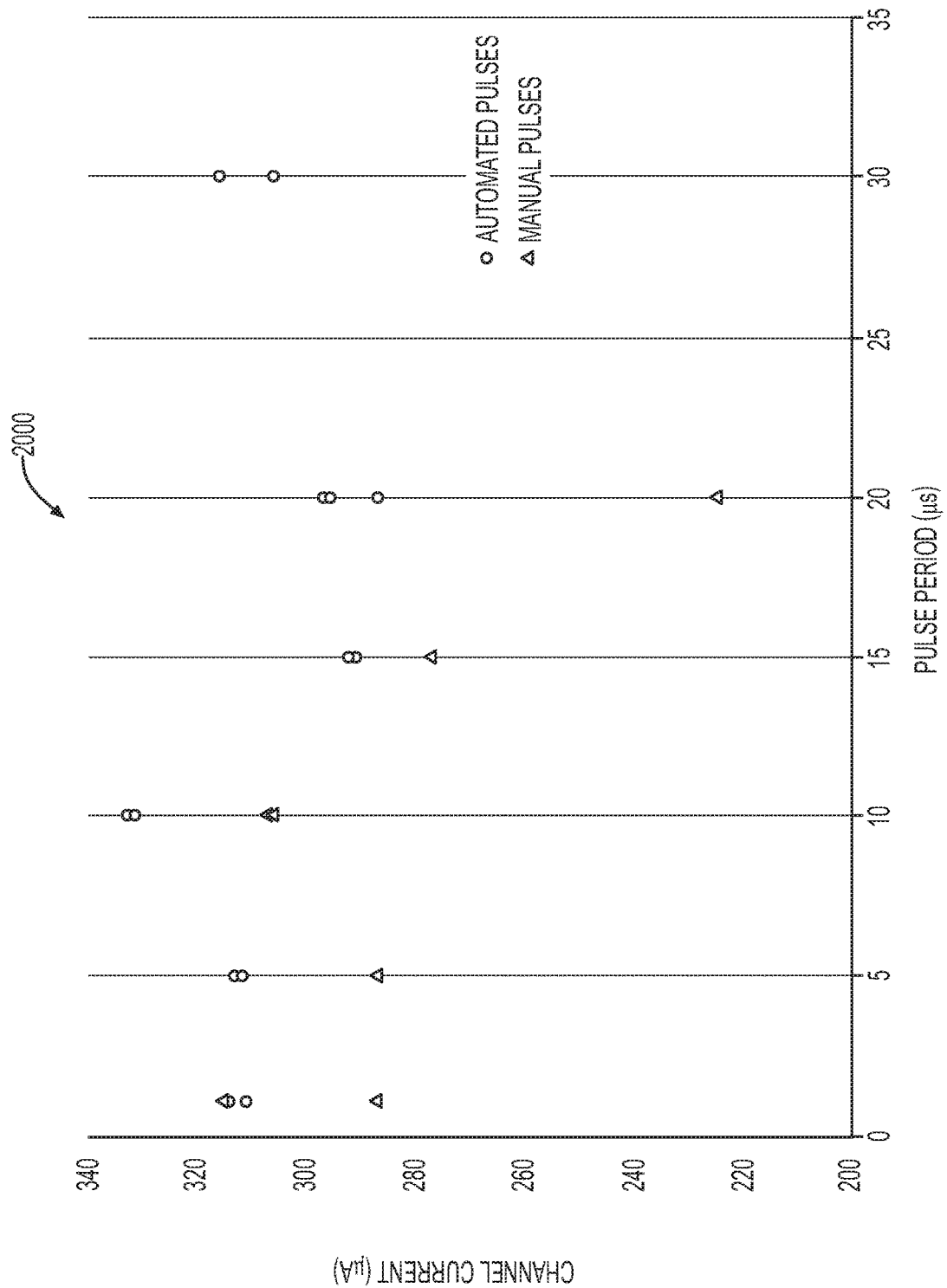
FIG. 20 is a graphic illustration of pre-charging repeatability for pre-charging an embodiment of a FG-MOSFET sensor of channel current versus pulse period for embodiments of FG-MOSFET sensors, according to the present invention.

FIG. 20 is a graphic illustration 2000 of pre-charging repeatability for pre-charging an embodiment of a FG-MOSFET sensor illustrating manual pulses and automated pulses plotted as channel current in microamperes (µA) versus the pulse period in microseconds (µs) for embodiments of FG-MOSFET sensors, according to the present invention. As shown from the plots in the graphic illustration 2000, the repeatability results show the fact that automated charging repetitions produce the same or approximately the same amount of current for the manual pulses and the automated pulses substantially every time.

To summarize the results of FIGS. 17-20, in order to pre-charge the gate (tunnel electrons onto the FG) negative pulses of 0.5 µs with a pulse height of −7.0 V is desirably required, and similar pulse height and width but in opposite polarity is desirably needed to discharge the floating gate of the FG-MOSFET sensors. The FG-MOSFET sensors devices are also characterized for the charging and discharging patterns desirably using square pulses. To summarize, in order to pre-charge the gate (tunnel electrons onto the floating gate) negative pulses of 0.5 µs with a pulse height of −7.0 V are desirably required, and positive pulses of a similar pulse height and width but in opposite polarity of 7.0 V (positive polarity) are needed to discharge the gate of the FG-MOSFET sensors devices. Thus, these pulses can be applied when the FG-MOSFET sensors devices are required to be charged or discharged depending upon the scenario.

As discussed, embodiments of the FG-MOSFET sensor, such as the FG-MOSFET sensors 540 and 520, and its thin-film oxide structure such as described with respect to FIGS. 4, 5, 9, 10 and 14, address various challenges in efficient and accurate use as a radiation sensor to enable it to be integrated on an integrated circuit chip with other components of a wireless dosimeter, such as those described in the wireless dosimeter chip-enabled tag 101, 200. Embodiments of the FG-MOSFET sensor, such as the FG-MOSFET sensors 540 and 520, include features typically not present in conventional FG-MOSFET sensors for radiation measurement that address various physical parameters that can significantly affect sensor performance, particularly with use of a thin-film oxide in the FG-MOSFET sensor structure. For example, embodiments of the thin oxide FG-MOSFET sensor unlike the conventional thick-film FG-MOSFET sensor include a structure that desirably does not include a passivation layer on the FG-MOSFET sensor device, the presence of a passivation layer reducing the sensitivity of the low-power FG-MOSFET sensor. As also discussed, such feature of the FG-MOSFET sensor typically not present in conventional FG-MOSFET sensors in this regard is a silicide blocked FG extension and silicide blocked gate finger, typically in regard to the FG-MOSFET higher sensitivity sensor 540 of the matched FG-MOSFET sensor pair 500, for example.

Also, embodiments of the FG-MOSFET sensor structure unlike conventional FG-MOSFET sensors, while they can include a single gate finger, desirably include a plurality of gate fingers that communicate with a floating gate extension of the FG-MOSFET sensor that receives the radiation, the plurality of gate fingers providing enhanced efficiency and flexibility and freedom to satisfy optimum device layout requirements for the low-power FG-MOSFET sensor structure.

Further, while use of a metal shield above the floating gate extension area has been described with FG-MOSFET sensors, such as those in US Patent Application, US2010/0096556A1 to Langis Roy et al., so as to allow for an increased thickness of the dielectric layer, as discussed, use of a metal protection layer on the surface of embodiments of the low-power FG-MOSFET sensor in a thin film FG-MOSFET structure, such as that of the embodiments of the FG-MOSFET sensors 520 and 540 of FIGS. 9 and 10, facilitates use of the thin-film FG-MOSFET sensor with a RFID wireless dosimeter chip in an RF-CMOS process to enhance isolation of the low-power FG-MOSFET sensor from external RF interferences, such as for wireless dosimeter applications, for example.

It is to be understood that the present invention is not limited to the embodiments described above, but encompasses any and all embodiments within the scope of the following claims.

We claim:

1. A low power floating gate metal-oxide semiconductor field-effect transistor (FG-MOSFET) sensor from a 0.13 μm radio frequency complementary metal-oxide semiconductor (RF-CMOS) process, comprising:
   a thin oxide layer from the 0.13 μm RF-CMOS process comprising a device well region;
   a source and a drain associated with the device well region, separated by a channel region;
   a floating gate extending over the channel region; and
   a floating gate extension communicating with the floating gate and extending over the thin oxide layer from the 0.13 μm RF-CMOS process adjacent the device well region,
   wherein the floating gate and the floating gate extension are each without a salicide layer or a silicide layer formed thereon.

2. A dual sensitivity matched sensor pair of low power floating gate metal-oxide semiconductor field-effect transistor (FG-MOSFET) sensors from a 0.13 μm radio frequency complementary metal-oxide semiconductor (RF-CMOS) process, comprising:
   a FG-MOSFET higher sensitivity sensor and a FG-MOSFET lower sensitivity sensor from the 0.13 μm RF-CMOS process on a common substrate, the FG-MOSFET higher sensitivity sensor having a higher sensitivity $S_1$ than a sensitivity $S_2$ of the FG-MOSFET lower sensitivity sensor, and the FG-MOSFET higher sensitivity sensor and the FGMOSFET lower sensitivity sensor each comprising:
   a thin oxide layer from the 0.13 μm RF-CMOS process situated within a device well region;
   a source and a drain associated with the device well region, separated by a channel region;
   a floating gate extending over the channel region; and
   a floating gate extension communicating with the floating gate and extending over a shallow trench isolation (STI) from the 0.13 μm RF-CMOS process adjacent to the device well region, wherein
   the floating gate and the floating gate extension of the FG-MOSFET higher sensitivity sensor are each without a salicide layer or a silicide layer formed thereon, and
   the floating gate and the floating gate extension of the FG-MOSFET lower sensitivity sensor each have a salicide layer or a silicide layer formed thereon.

3. The dual sensitivity matched sensor pair of low power FG-MOSFET sensors from a 0.13 μm RF-CMOS process according to claim 2, wherein:
   respective channel widths, W, and channel lengths, L, of the FG-MOSFET higher sensitivity sensor and the FGMOSFET lower sensitivity sensor are substantially identical.

4. The dual sensitivity matched sensor pair of low power FG-MOSFET sensors from a 0.13 μm RF-CMOS process according to claim 2, further comprising:
   a pre-charger communicatively associated with the floating gate extension for each of the FG-MOSFET higher sensitivity sensor and the FG-MOSFET lower sensitivity sensor for one or more of pre-charging and discharging the floating gate of the FG-MOSFET higher sensitivity sensor and the floating gate of the FG-MOSFET lower sensitivity sensor.

5. The dual sensitivity matched sensor pair of low power FG-MOSFET sensors from a 0.13 μm RF-CMOS process according to claim 2, wherein:
   the FG-MOSFET higher sensitivity sensor and the FG-MOSFET lower sensitivity sensor are each a PMOS floating gate transistor.

6. The dual sensitivity matched sensor pair of low power FG-MOSFET sensors from a 0.13 μm RF-CMOS process according to claim 2, further comprising:
   a shielding metal layer positioned on the FG-MOSFET higher sensitivity sensor and on the FG-MOSFET lower sensitivity sensor to isolate the FG-MOSFET higher sensitivity sensor and the FG-MOSFET lower sensitivity sensor from external radio frequency (RF) interferences.

7. The dual sensitivity matched sensor pair of low power FG-MOSFET sensors from a 0.13 μm RF-CMOS process according to claim 2, wherein:
   the floating gate of at least one or more of the FG-MOSFET higher sensitivity sensor and the FG-MOSFET lower sensitivity sensor includes a plurality of gate fingers forming the floating gate.

8. The dual sensitivity matched sensor pair of low power FG-MOSFET sensors from a 0.13 μm RF-CMOS process according to claim 2, wherein:
   the FG-MOSFET higher sensitivity sensor and the FG-MOSFET lower sensitivity sensor are monolithically integrated on a same substrate from the 0.13 μm RF-CMOS process.

9. A method for measuring a radiation dose using a radiation sensor comprising a matched sensor pair of low power floating gate metal-oxide semiconductor field-effect transistor (FG-MOSFET) sensors from a 0.13 μm radio frequency complementary metal-oxide semiconductor (RF-CMOS) process, the matched sensor pair comprising a FG-MOSFET higher sensitivity sensor and a FG-MOSFET lower sensitivity sensor from the 0.13 μm RF-CMOS process on a common substrate, the FG-MOSFET higher sensitivity sensor having a higher sensitivity than a sensitivity of the FG-MOSFET lower sensitivity sensor, and the FG-MOSFET higher sensitivity sensor and the FGMOSFET lower sensitivity sensor each including a thin oxide layer from the 0.13 μm RF-CMOS process, a source and a drain associated with a device well region, separated by a channel region, a floating gate extending over the channel region, and a floating gate extension communicating with the floating gate and extending over the thin oxide layer from the 0.13 μm RF-CMOS process adjacent to the device well region, wherein the floating gate and the floating gate extension of the FG-MOSFET higher sensitivity sensor are each without a salicide layer or a silicide layer formed thereon, and the floating gate and the floating gate extension of the FG-MOSFET lower sensitivity sensor each have a salicide layer or a silicide layer formed thereon, comprising the steps of:
- pre-charging the floating gate of each of the FG-MOSFET higher sensitivity sensor and the FG-MOSFET lower sensitivity sensor to a predetermined voltage value;
- exposing the FG-MOSFET higher sensitivity sensor and the FG-MOSFET lower sensitivity sensor to radiation from a radiation source;
- measuring a drain source channel current $I_{DS}$ for each of the FG-MOSFET higher sensitivity sensor and the FG-MOSFET lower sensitivity sensor exposed to the radiation from the radiation source for a given radiation duration time T;
- determining a first sensitivity $S_1$ corresponding to the measured drain source channel current $I_{DS}$ at the given radiation duration time T for the FG-MOSFET higher sensitivity sensor; and
- determining a second sensitivity $S_2$ corresponding to the measured drain source channel current $I_{DS}$ at the given radiation duration time T for the FG-MOSFET lower sensitivity sensor.

10. The method for measuring a radiation dose using a radiation sensor comprising a matched sensor pair of low power FG-MOSFET sensors from a 0.13 μm RF-CMOS process according to claim 9, wherein:
- a measurement of a radiation dose received by the FG-MOSFET higher sensitivity sensor and a measurement of a radiation dose received by the FG-MOSFET lower sensitivity sensor of the matched sensor pair at the given radiation duration time T corresponds to the two sensitivities, $S_1$ and $S_2$, of the matched sensor pair.

11. The method for measuring a radiation dose using a radiation sensor comprising a matched sensor pair of low power FG-MOSFET sensors from a 0.13 μm RF-CMOS process according to claim 9, wherein:
- a radiation dose respectively received by each of the FG-MOSFET sensors of the matched sensor pair at the given radiation duration time T corresponds to the two sensitivities, $S_1$ and $S_2$, of the matched sensor pair.

12. The method for measuring a radiation dose using a radiation sensor comprising a matched sensor pair of low power FG-MOSFET sensors from a 0.13 μm RF-CMOS process according to claim 9, wherein:
- pre-charging the floating gate of each of the FG-MOSFET higher sensitivity sensor and the FG-MOSFET lower sensitivity sensor to the predetermined voltage value includes pre-charging by applying negative voltage pulses of −7.0 volts (V) having a pulse width of 0.5 microseconds (μs) to the floating gate of each of the FG-MOSFET higher sensitivity sensor and the FG-MOSFET lower sensitivity sensor.

13. The method for measuring a radiation dose using a radiation sensor comprising a matched sensor pair of low power FG-MOSFET sensors from a 0.13 μm RF-CMOS process according to claim 12, further comprising the step of:
- discharging the floating gate of each of the FG-MOSFET higher sensitivity sensor and the FG-MOSFET lower sensitivity sensor after delivery of the radiation from the radiation source by applying positive voltage pulses of 7.0 volts (V) having a pulse width of 0.5 microseconds (μs) to the floating gate of each of the FG-MOSFET higher sensitivity sensor and the FG-MOSFET lower sensitivity sensor to enable the FG-MOSFET higher sensitivity sensor and the FG-MOSFET lower sensitivity sensor to measure another radiation dose.

14. The method for measuring a radiation dose using a radiation sensor comprising a matched sensor pair of low power FG-MOSFET sensors from a 0.13 μm RF-CMOS process according to claim 9, further comprising the step of:
- discharging the floating gate of each of the FG-MOSFET higher sensitivity sensor and the FG-MOSFET lower sensitivity sensor after delivery of the radiation from the radiation source by applying positive voltage pulses of 7.0 volts (V) having a pulse width of 0.5 microseconds (μs) to the floating gate of each of the FG-MOSFET higher sensitivity sensor and the FG-MOSFET lower sensitivity sensor to enable the FG-MOSFET higher sensitivity sensor and the FG-MOSFET lower sensitivity sensor to measure another radiation dose.

15. A method for pre-charging a low power floating gate metal-oxide semiconductor field-effect transistor (FG-MOSFET) sensor from a 0.13 μm radio frequency complementary metal-oxide semiconductor (RF-CMOS) process for radiation measurements, comprising the step of:
- pre-charging a floating gate of the FG-MOSFET sensor by applying negative voltage pulses of −7.0 volts (V) having a pulse width of 0.5 microseconds (μs) to the floating gate.

16. The method for pre-charging a low power FG-MOSFET sensor from a 0.13 μm RF-CMOS process for radiation measurements according to claim 15, further comprising the step of:
- discharging the floating gate of the FG-MOSFET sensor after delivery of radiation from a radiation source to the FG-MOSFET sensor by applying to the floating gate positive voltage pulses of 7.0 volts (V) having a pulse width of 0.5 microseconds (μs) to enable the FG-MOSFET sensor to measure another radiation dose.

* * * * *